United States Patent
Abe

(10) Patent No.: US 10,875,294 B2
(45) Date of Patent: Dec. 29, 2020

(54) LIQUID EJECTING APPARATUS

(71) Applicant: Seiko Epson Corporation, Tokyo (JP)

(72) Inventor: Akira Abe, Hachioji (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/284,120

(22) Filed: Feb. 25, 2019

(65) Prior Publication Data

US 2019/0263114 A1  Aug. 29, 2019

(30) Foreign Application Priority Data

Feb. 26, 2018  (JP) ................... 2018-031514

(51) Int. Cl.
*B41J 2/045* (2006.01)
*H03K 5/24* (2006.01)
*H03K 4/94* (2006.01)

(52) U.S. Cl.
CPC ....... *B41J 2/04541* (2013.01); *B41J 2/04581* (2013.01); *B41J 2/04588* (2013.01); *B41J 2/04593* (2013.01); *B41J 2/04596* (2013.01); *H03K 5/24* (2013.01); *H03K 4/94* (2013.01)

(58) Field of Classification Search
CPC ............... B41J 2/04541; B41J 2/04593; B41J 2/04596; B41J 2/04581; B41J 2/04588; H03K 5/24; H03K 4/94
See application file for complete search history.

(56) References Cited

U.S. PATENT DOCUMENTS

| | | | |
|---|---|---|---|
| 2009/0206888 A1 | 8/2009 | Kitazawa et al. | |
| 2017/0113458 A1* | 4/2017 | Abe | B41J 2/04596 |
| 2017/0246860 A1 | 8/2017 | Abe | |
| 2019/0009525 A1* | 1/2019 | Yamada | B41J 2/04581 |
| 2019/0009526 A1* | 1/2019 | Yamada | B41J 2/04588 |

FOREIGN PATENT DOCUMENTS

| | | |
|---|---|---|
| JP | 2009-190287 A | 8/2009 |
| JP | 2010-114711 A | 5/2010 |
| JP | 2017-149064 A | 8/2017 |

* cited by examiner

*Primary Examiner* — Justin Seo

(74) *Attorney, Agent, or Firm* — Harness, Dickey & Pierce, P.L.C.

(57) ABSTRACT

A driving circuit includes a comparator that compares a voltage of an original driving signal with a voltage of a feedback signal of a driving signal, transistors, and a control signal generating circuit that generates a gate signal to the transistor and a gate signal to the transistor. The control signal generating circuit controls to alternately switch on the transistors. Driving abilities of the transistors are switched to be lowered by insertion of capacitors by an adjustment circuit.

12 Claims, 16 Drawing Sheets

LIQUID EJECTING APPARATUS

The entire disclosure of Japanese Patent Application No. 2018-031514, filed Feb. 26, 2018 is expressly incorporated by reference herein.

BACKGROUND

1. Technical Field

The present invention relates to, for example, a liquid ejecting apparatus.

2. Related Art

An ink jet printer that ejects ink to print an image or a document has been known as an example of a liquid ejecting apparatus. In the ink jet printer, a piezoelectric element (for example, a piezo element) is used to eject the ink, and the piezoelectric elements are provided to correspond to a plurality of nozzles in a print head, respectively. As the piezoelectric element is driven according to a driving signal, a predetermined amount of ink is ejected from the nozzle at a predetermined timing to form a dot. Since the piezoelectric element is a capacitive load like a capacitor in terms of electricity, it is required to supply a sufficient current in order to operate the piezoelectric element of each nozzle.

Therefore, in the ink jet printer, an original driving signal which is a source of the driving signal is amplified by an amplifier circuit and is supplied to the print head as the driving signal, to drive the piezoelectric element. A method (a linear amplification method, for example, see JP-A-2009-190287) of amplifying a current of the original driving signal to class AB is mentioned as the amplifier circuit.

However, in the linear amplification method, power consumption is large, and energy efficiency is bad. Thus, in recent years, a class D amplification method has been proposed (for example, see JP-A-2010-114711). In short, in the class D amplification method, the original driving signal is pulse-modulated, switching between a high side transistor and a low side transistor connected in series to each other between power supply voltages is performed according to the pulse-modulated signal, and an output signal according to this switching is filtered by a low pass filter, so that the original driving signal is amplified.

Although the energy efficiency is higher in the class D amplification method than in the linear amplification method, electric power consumed by the low pass filter cannot be ignored. Therefore, a new-type driving circuit for further improving power consumption has been proposed (see JP-A-2017-149064).

In the new-type driving circuit, the power consumption can be improved. However, when the number of nozzles (the number of piezoelectric elements) greatly increases in order to meet requirements of high-speed printing and high-definition printing, waveform precision of the driving signal deteriorates, and liquid ejection accuracy decreases.

SUMMARY

According to an aspect of the invention, there is provided a liquid ejecting apparatus including a print head that includes a nozzle and a piezoelectric element displaced by being applied with a driving signal, and ejects a liquid from the nozzle by the displacement of the piezoelectric element, a comparator that compares a voltage of an original driving signal with a voltage of a feedback signal which is a signal obtained by feeding back the driving signal, a transistor pair that includes a first transistor having a first gate terminal and a second transistor having a second gate terminal, and outputs the driving signal, a control signal generating circuit to which an output signal of the comparator is input, and which generates a first control signal for controlling a switching operation of the first transistor and a second control signal for controlling a switching operation of the second transistor such that the first transistor and the second transistor are alternately switched on, and an element that changes an output characteristic of the first transistor or the second transistor between the first gate terminal or the second gate terminal and the control signal generating circuit.

In the liquid ejecting apparatus, since the first transistor and the second transistor are alternately switched on based on a result of the comparison between the voltage of the original driving signal and the voltage of the feedback signal, the voltage of the driving signal alternately and repeatedly increases and decreases, that is, oscillates. Here, when the voltage of the feedback signal becomes higher than the voltage of the original driving signal, the second transistor is switched on promptly, and the voltage of the driving signal decreases. When the voltage of the feedback signal becomes lower than the voltage of the original driving signal, the first transistor is switched on promptly, and the voltage of the driving signal increases. Therefore, according to the liquid ejecting apparatus, since the voltage followability of the driving signal with respect to the original driving signal is improved, ejection accuracy of the liquid in addition to waveform accuracy of the driving signal can be improved.

Further, according to the liquid ejecting apparatus, since the output characteristic of the first transistor or the second transistor is varied by the element, for example, in a voltage changing period of the original driving signal, a relatively good output characteristic is obtained, and in a voltage-constant period of the original driving signal, a relatively degraded output characteristic is obtained. Thus, an oscillation width obtained by alternately and repeatedly increasing and decreasing the voltage of the driving signal can be made smaller in the voltage changing period than in the voltage-constant period of the original driving signal. Therefore, according to the liquid ejecting apparatus, waveform accuracy of the driving signal can be further improved as compared with a configuration in which the output characteristic is not changed.

In the liquid ejecting apparatus, the output characteristic may be a characteristic of a voltage at which the first transistor or the second transistor is switched on with respect to a voltage of the first control signal or the second control signal.

When a voltage range in which both the first transistor and the second transistor are switched off with respect to a change in a voltage of the output signal of the comparator is expressed as a dead zone, with this configuration, the dead zone in a period during which the voltage of the original driving signal is constant may be smaller than the dead zone in a period during which the voltage of the original driving signal changes. Therefore, the waveform accuracy of the driving signal can be improved.

In the liquid ejecting apparatus, the element may be a first capacitor that is capable of being switched to an electric connection state or an electric disconnection state between the first gate terminal and a drain terminal of the first transistor, and a second capacitor that is capable of being switched to an electric connection state or an electric disconnection state between the second gate terminal and a drain terminal of the second transistor.

In the voltage changing period of the original driving signal, since it is necessary to sufficiently drive the piezoelectric element, a high gain is required. However, in the voltage-constant period of the original driving signal, the high gain is not required. In the above configuration, when the capacitor is connected between the gate terminal and the drain terminal, since the amount of negative feedback becomes larger as a frequency becomes higher, the gain decreases accordingly. Therefore, in the period during which the voltage of the original driving signal changes, the gain can be increased by the disconnection of the capacitor. In the period during which the voltage of the original driving signal is constant, the gain can be decreased by the connection of the capacitor, and as a result, the waveform accuracy of the driving signal can be improved.

The term "connection" or all variations thereof mean all direct or indirect connection or direct or indirect coupling between two or more elements, and include a case where two elements are connected to each other with one or more intermediate elements interposed therebetween.

In the liquid ejecting apparatus, the element may be a first resistive element that is capable of being switched to an electric connection state or an electric disconnection state between the first gate terminal and a drain terminal of the first transistor, and a second resistive element that is capable of being switched to an electric connection state or an electric disconnection state between the second gate terminal and a drain terminal of the second transistor.

In the above configuration, when the resistive element is connected between the gate terminal and the drain terminal, since the amount of negative feedback becomes large, the gain decreases accordingly. Therefore, in the period during which the voltage of the original driving signal changes, the gain can be increased by the disconnection of the resistive element. In the period during which the voltage of the original driving signal is constant, the gain can be decreased by the connection of the resistive element, and as a result, the waveform accuracy of the driving signal can be improved.

In the liquid ejecting apparatus, the element may be a switch that switches driving abilities of the first transistor and the second transistor.

In the above configuration, a switch is selected such that the driving abilities become relatively large in the period during which the voltage of the original driving signal changes and the driving abilities become relatively small in the period during which the voltage of the original driving signal is constant. As a result, the waveform accuracy of the driving signal can be improved.

In the liquid ejecting apparatus, the driving signal may have a first region in which the first transistor and the second transistor are alternately switched on so that a voltage of the driving signal increases, a second region in which the first transistor and the second transistor are alternately switched on so that the voltage of the driving signal decreases, a third region following the second region between the first region and the second region, and a fourth region following the first region between the first region and the second region, in which when the voltage of the driving signal belongs to the third region or the fourth region, the first control signal or the second control signal is supplied to the first gate terminal or the second gate terminal through the element.

With this configuration, when the voltage of the driving signal changes from the first region (or the second region) in which an oscillation center value changes to the third region (or the fourth region) in which the oscillation center value is constant, since an oscillation width can be reduced, the waveform accuracy of the driving signal can be further improved as compared to a configuration in which the oscillation width is not reduced.

In the liquid ejecting apparatus, an oscillation width, which is a difference between a voltage maximum value of the driving signal when the first transistor is switched on and a voltage minimum value of the driving signal when the second transistor is switched on in the third region, may be smaller than an oscillation width, which is a difference between a voltage maximum value of the driving signal when the first transistor is switched on and a voltage minimum value of the driving signal when the second transistor is switched on in the fourth region.

According to the piezoelectric element, the amount of displacement in the same voltage difference is larger (efficiency of the displacement is better) in a case where an applied voltage is low than in a case where the applied voltage is high. In contrast, in such a piezoelectric element, when the applied voltage is low, since the amount of the displacement increases due to even a slight voltage difference, high waveform accuracy is required. With this configuration, since the oscillation width of the third region in which the voltage is low is smaller than the oscillation width of the fourth region in which the voltage is high, as a result of improving the waveform accuracy of the driving signal, the ejection accuracy of the liquid can be improved.

According to another aspect of the invention, there is provided a liquid ejecting apparatus including a print head that includes a nozzle and a piezoelectric element displaced by being applied with a driving signal, and ejects a liquid from the nozzle by the displacement of the piezoelectric element, a comparator that compares a voltage of an original driving signal with a voltage of a feedback signal which is a signal obtained by feeding back the driving signal, a first transistor pair that includes a first transistor having a first gate terminal and a second transistor having a second gate terminal, and outputs the driving signal when a voltage of the original driving signal belongs to a first range, a second transistor pair that includes a third transistor having a third gate terminal and a fourth transistor having a fourth gate terminal, and outputs the driving signal when the voltage of the original driving signal belongs to a second range that is higher than the first range, and a control signal generating circuit to which an output signal of the comparator is input, and which generates a first control signal for controlling a switching operation of the first transistor or the third transistor and a second control signal for controlling a switching operation of the second transistor or the fourth transistor, such that the first transistor and the second transistor or the third transistor and the fourth transistor are alternately switched on, in which an output characteristic of the first transistor or the second transistor is different from an output characteristic of the third transistor or the fourth transistor.

According to the liquid ejecting apparatus, like the liquid ejecting apparatus described above, since the voltage followability of the driving signal with respect to the original driving signal is improved, the ejection accuracy of the liquid in addition to the waveform accuracy of the driving signal can be improved. Further, according to the liquid ejecting apparatus according to the another aspect, as compared to the liquid ejecting apparatus according to the aspect, since the withstand voltage of a constituent element in the comparator and the control signal generating circuit becomes low, enlargement of the size of an element and the like can be suppressed.

In the liquid ejecting apparatus, in a period during which a voltage of the original driving signal increases, the first transistor and the second transistor may be alternately switched on.

With this configuration, when the voltage of the driving signal increases following the voltage of the original driving signal, since the voltage of the driving signal rapidly changes from increasing to decreasing when the voltage of the feedback signal becomes higher than the voltage of the original driving signal and the voltage of the driving signal rapidly changes from decreasing to increasing when the voltage of the feedback signal becomes lower than the voltage of the original driving signal, ripples generated in the driving signal are reduced. Therefore, in the above configuration, the waveform accuracy of the driving signal can be improved, and the ejection accuracy of the liquid can be improved.

In the liquid ejecting apparatus, in a period during which a voltage of the original driving signal decreases, the first transistor and the second transistor may be alternately switched on.

With this configuration, when the voltage of the driving signal decreases following the voltage of the original driving signal, since the voltage of the driving signal rapidly changes from decreasing to increasing when the voltage of the feedback signal becomes lowers than the voltage of the original driving signal and the voltage of the driving signal rapidly changes from increasing to decreasing when the voltage of the feedback signal becomes higher than the voltage of the original driving signal, ripples generated in the driving signal are reduced. Therefore, in the above configuration, the waveform accuracy of the driving signal can be improved, and the ejection accuracy of the liquid can be improved.

In the liquid ejecting apparatus, in a period during which a voltage of the original driving signal is constant, the first transistor and the second transistor may be alternately switched on.

With this configuration, when the voltage of the original driving signal is substantially constant, since the voltage of the driving signal rapidly changes from increasing to decreasing when the voltage of the feedback signal becomes higher than the voltage of the original driving signal and the voltage of the driving signal rapidly changes from decreasing to increasing when the voltage of the feedback signal becomes lower than the voltage of the original driving signal, an error between the voltage of the driving signal and a desired voltage corresponding to the voltage of the original driving signal is reduced. Therefore, in the above configuration, the waveform accuracy of the driving signal can be improved, and the ejection accuracy of the liquid can be improved.

In the liquid ejecting apparatus, the print head may include more than 600 nozzles arranged at a density of 300 or more per inch.

In the configuration in which the print head may include more than 600 nozzles arranged at a density of 300 or more per inch, since the load of the driving circuit increases and the current I increases, noise having a magnitude proportional to the product (L×dI/dt) of the parasitic inductance L and the change rate of the current I is superimposed in the driving signal, and large ripples are easy to occur. In the liquid ejecting apparatus, even in the period during which the voltage of the original driving signal increases or decreases, since the followability of the voltage of the driving signal with respect to the voltage of the original driving signal is high, even when the number of driven piezoelectric elements increases and the load increases, ripples generated in the driving signal can be kept small. Therefore, in the above configuration, the waveform accuracy of the driving signal can be improved, and the ejection accuracy of the liquid can be improved.

According to still another aspect of the invention, there is provided a liquid ejecting apparatus including a print head that includes a nozzle and a piezoelectric element displaced by being applied with a driving signal, and ejects a liquid from the nozzle by the displacement of the piezoelectric element, a comparator that compares a voltage of an original driving signal with a voltage of a feedback signal which is a signal obtained by feeding back the driving signal, a transistor pair that includes a first transistor having a first gate terminal and a second transistor having a second gate terminal, and outputs the driving signal, a control signal generating circuit to which an output signal of the comparator is input, and which generates a first control signal for controlling a switching operation of the first transistor and a second control signal for controlling a switching operation of the second transistor such that the first transistor and the second transistor are alternately switched on, and a gate control circuit that is provided between the first transistor and the second transistor and the control signal generating circuit, and is electrically connected to the first gate terminal and the second gate terminal.

According to the liquid ejecting apparatus, like the liquid ejecting apparatus described above, since the voltage followability of the driving signal with respect to the original driving signal is improved, the ejection accuracy of the liquid in addition to the waveform accuracy of the driving signal can be improved. Further, according to the liquid ejecting apparatus, as compared to the liquid ejecting apparatus described above, since the withstand voltage of a constituent element in the comparator and the control signal generating circuit becomes low, enlargement of the size of an element and the like can be suppressed.

BRIEF DESCRIPTION OF THE DRAWINGS

The invention will be described with reference to the accompanying drawings, wherein like numbers reference like elements.

FIG. 11 is a diagram illustrating a waveform of a driving signal or the like.

DESCRIPTION OF EXEMPLARY EMBODIMENTS

Hereinafter, embodiments of the invention will be described with reference to the accompanying drawings. In each drawing, dimensions and scales of parts are appropriately different from actual dimensions and scales. Further, since the embodiments described below are preferable specific examples of the invention, various technically preferable limitations are provided. However, the scope of the invention is not limited to these embodiments unless specifically stated to limit the invention in the following description.

Figure 1:
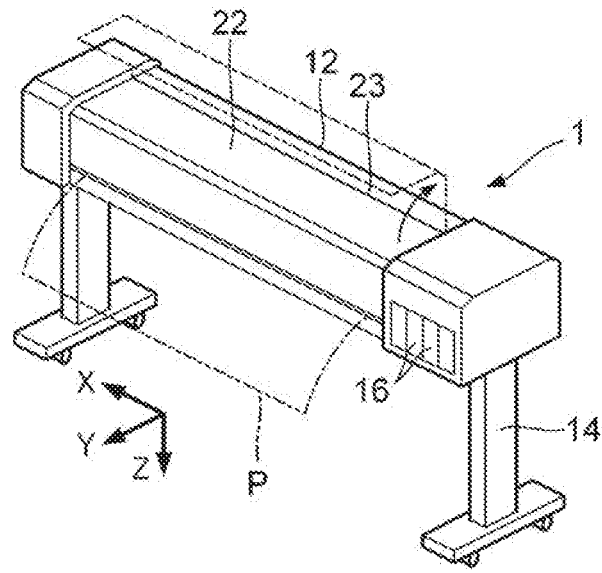
FIG. 1 is a perspective view illustrating an ink jet printer according to an embodiment.

FIG. 1 is a view illustrating a configuration of an ink jet printer 1 which is an example of a liquid ejecting apparatus according to the present embodiment.

The ink jet printer 1 prints an image on a surface of a medium P by ejecting an ink which is an example of liquid to the medium P. The medium P is a paper, a film, or the like, to which the ink is to be ejected. The ink jet printer 1, which is a printing apparatus (a large format printer (LFP)) that can perform printing on the medium P having a size that is equal to or more than A3 in the International standard, has a housing 12 and a leg portion 14 as illustrated in the drawing.

The housing 12 is an elongated structure along an X direction corresponding to the width direction of the medium P. In the present embodiment, a plurality of liquid containers 16 that store different kinds of inks are mounted on the housing 12. The leg portion 14 supports the housing 12 at a predetermined height.

The same kind of ink may be stored in the plurality of liquid containers 16.

In the following description, a vertical direction, that is, a direction in which gravity acts, is expressed as a Z direction, a direction that is perpendicular to an XZ plane, that is, a direction in which the medium P is fed, is expressed as a Y direction. Further, in the drawing, a lid member 22 is a cover that is shaft-supported on a rotary shaft 23 that is parallel to the X direction, and a user can open/close the lid member 22 manually.

Figure 2:
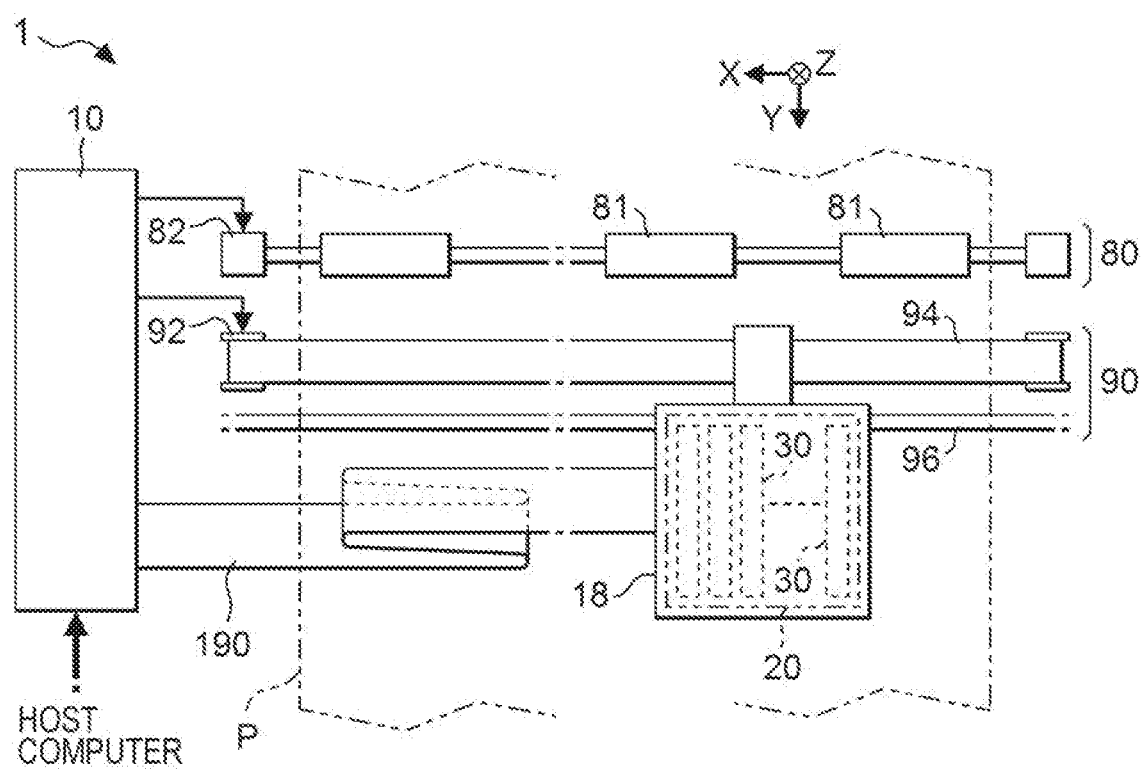
FIG. 2 is a diagram illustrating an internal configuration of the ink jet printer.

FIG. 2 is a diagram illustrating an internal configuration of the ink jet printer 1.

As illustrated in the drawing, a control module 10, a carriage 18, a transport mechanism 80, and a moving mechanism 90 are accommodated inside the ink jet printer 1. In the present embodiment, a head module 20 including a plurality of print heads 30 is mounted on the carriage 18.

When image data is supplied from an external host computer, the control module 10 controls each element of the ink jet printer 1, particularly, the print heads 30, the transport mechanism 80, and the moving mechanism 90, in order to print an image defined by the corresponding image, on the medium P.

The transport mechanism 80 transports the medium P in the Y direction. In detail, the transport mechanism 80 includes a transport roller 81 of which a rotary shaft is parallel to the X direction and a driving unit (for example, a motor) 82 that rotates the transport roller 81 under a control of the control module 10. The transport mechanism may be a mechanism that rotates a roll on which the medium P is wound and supplies the medium P to an inside of the housing 12 or a mechanism that winds the medium P discharged from the housing 12.

The carriage 18 has the head module 20 mounted thereon, and reciprocates along the X direction by the moving mechanism 90. In detail, the moving mechanism 90 includes an endless belt 94 bridged along the X direction, a guide shaft 96 that regulates movement of the carriage 18 in a direction that is substantially parallel to the X direction, and a driving unit (for example, a motor) 92 that drives the endless belt 94 under the control of the control module 10.

Various driving signals, control signals, and the like supplied from the control module 10 are supplied to the head module 20 through a flexible flat cable (FFC) 190 having flexibility. Since the ink jet printer 1 according to the present embodiment is compatible with large format printing, an operation area of the carriage 18 becomes large.

When the operation area of the carriage 18 becomes large, it is also necessary to make the FFC 190 large. In the present embodiment, although the ink jet printer 1 sets the printable medium P to A3 or more, an upper limit thereof is aimed at 75 inches. This is because when the size of the medium P exceeds 75 inches, a possibility increases that an impedance component of each wiring in the FFC 190 becomes large, a voltage drop of the driving signal becomes large, printing accuracy and printing stability are lowered, and thus the ink is erroneously ejected.

Further, in the head module 20, the ink is supplied from the liquid containers 16 in addition to the FFC 190 through a tube. However, the tube is not illustrated.

Figure 3:
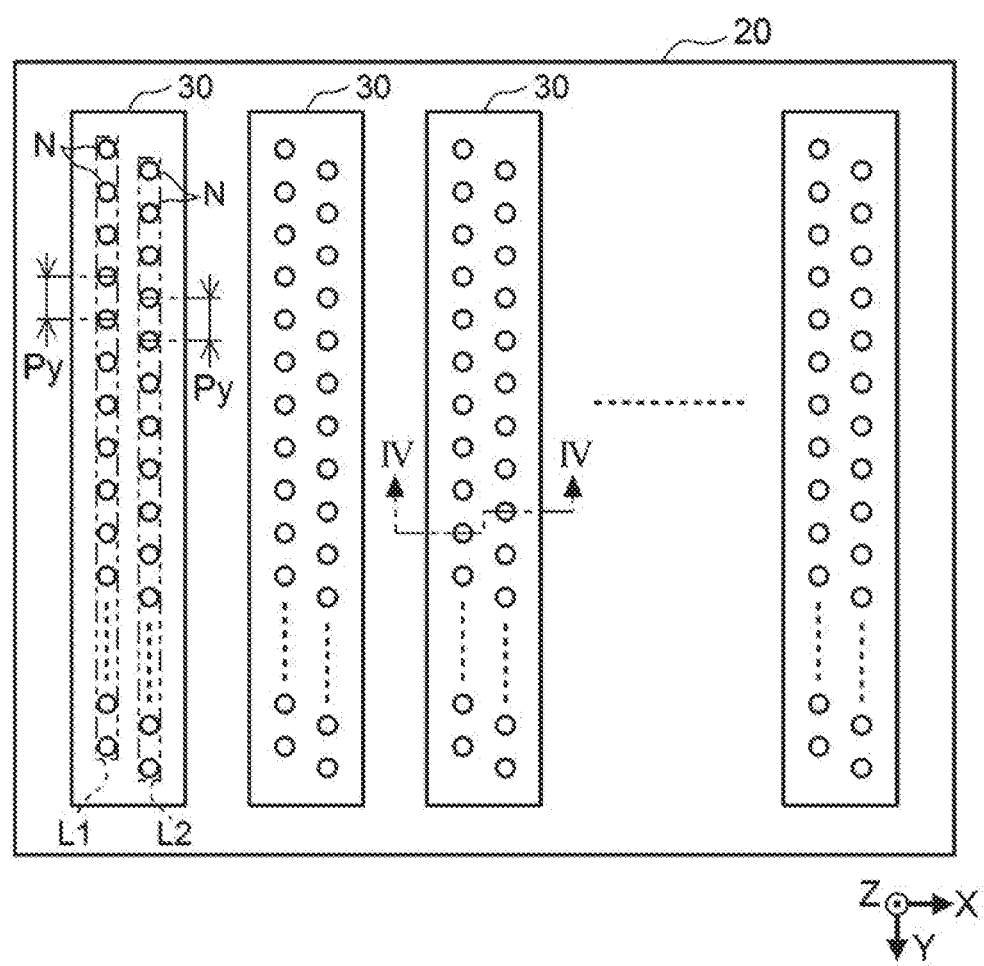
FIG. 3 is a diagram illustrating an example of nozzle arrangement.

FIG. 3 is a diagram illustrating a configuration when an ink ejection surface in the head module 20 is viewed from the medium P. As illustrated in the drawing, the head module 20 has the plurality of print heads 30 arranged side by side along the X direction. Each of the print heads 30 has two nozzle rows L1 and L2 which are elongated along the Y direction and are spaced apart from each other along the X direction when viewed from the medium P, and nozzles N are arranged in one nozzle row L1 or L2 at a pitch Py along the Y direction.

In the example of the drawing, the nozzles N belonging to the nozzle row L1 and the nozzles N belonging to the nozzle row L2 are arranged such that coordinates thereof in the Y direction are spaced apart from each other by approximately a half of the pitch Py, but positions thereof in the Y direction substantially coincide with each other.

When the number of the nozzles N in one nozzle row L1 or L2 is m (m is an integer of 2 or more), the number of the nozzles N in one print head 30 is 2 m.

Here, in the present embodiment, actually, the nozzles N in the one nozzle row L1 or L2 are provided at a density of 300 or more per inch by a length of one inch or more. Therefore, in one print head 30, more than 600 nozzles N are provided in two rows of the nozzle rows L1 and L2.

One of, for example, black, cyan, magenta, and yellow is assigned to the plurality of print heads 30, and one print head 30 ejects an ink having the assigned color from the nozzles N. Inks having different colors may be ejected from the nozzles N in the nozzle rows L1 and L2 in one print head 30.

In terms of electricity, one print head 30 is roughly divided into an actuator module including a piezoelectric element as will be described below and an IC module that selects a driving signal to the piezoelectric element. Thus, first, the actuator module in the print head 30 will be described.

Figure 4:
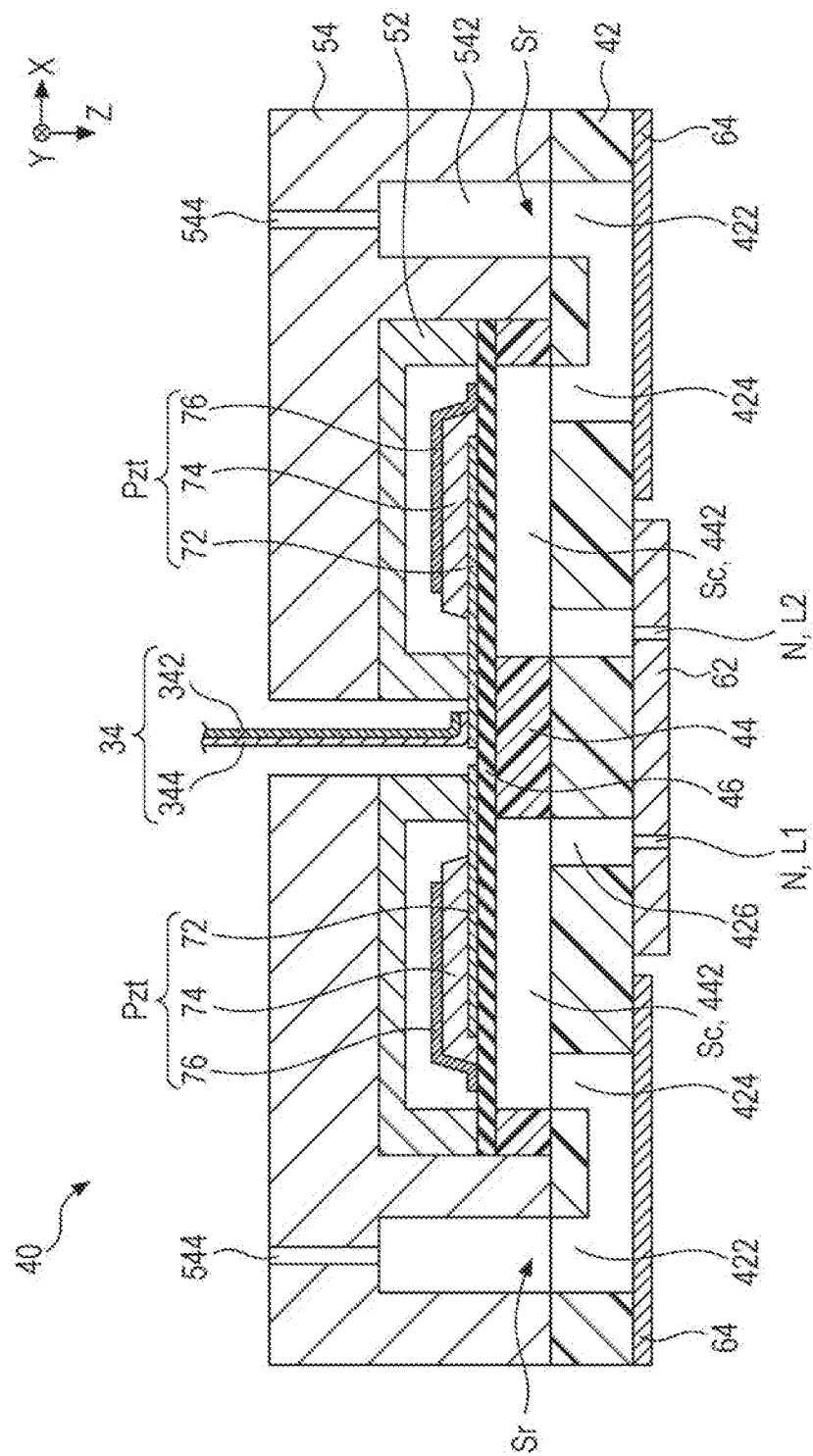
FIG. 4 is a cross-sectional view illustrating a configuration of an actuator module.

FIG. 4 is a cross-sectional view illustrating a structure of the actuator module 40. In detail, FIG. 4 is a cross-sectional view (a cross section broken along the ZX plane) obtained when the actuator module of the print head 30 is broken almost along line IV-IV in FIG. 3.

As illustrated in FIG. 4, the actuator module 40 has a structure in which a pressure chamber substrate 44, a diaphragm 46, a sealing body 52, and a support body 54 are provided on a negative side surface of a flow channel substrate 42 in the Z direction and a nozzle plate 62 and a compliance portion 64 are provided on a positive side surface of the flow channel substrate 42 in the Z direction. The actuator module 40 is a substantially flat plate-shaped member elongated in the Y direction, which is like the print head 30, and is mutually fixed using, for example, an adhesive. Further, the flow channel substrate 42 and the pressure chamber substrate 44 are formed with, for example, a silicon single crystal substrate.

The nozzles N are formed on the nozzle plate 62. As outlined in FIG. 3, the print head 30 has a structure in which the nozzles N belonging to the nozzle row L1 and the nozzles N belonging to the nozzle row L2 are shifted from each other by a half of the pitch Py in the W1 direction. However, since the other configurations are formed approximately symmetrically, the following description will be focused on the nozzle row L1.

The flow channel substrate 42, which is a flat plate material forming a flow channel of ink, includes an opening portion 422, a supply flow channel 424, and a communication flow channel 426. The supply flow channel 424 and the communication flow channel 426 are formed on each nozzle, and the opening portion 422 is formed to continue over the plurality of nozzles that eject the ink having the same color.

The support body 54 is fixed to the negative side surface of the flow channel substrate 42 in the Z direction. An accommodation portion 542 and an introduction flow channel 544 are formed in the support body 54. The accommodation portion 542 is a concave portion (a depression) having an outer shape corresponding to the opening portion 422 of the flow channel substrate 42 in plan view (that is, when viewed from the Z direction), and the introduction flow channel 544 is a flow channel communicating with the accommodation portion 542.

A space through which the opening portion 422 of the flow channel substrate 42 and the accommodation portion 542 of the support body 54 communicate with each other functions as a liquid storage chamber (reservoir) Sr. The liquid storage chamber Sr stores the ink that has passed through the liquid containers 16 (see FIG. 1) and the introduction flow channel 544. The liquid storage chamber Sr may be formed independently with respect to each color of the ink. However, in the present embodiment, for simplification of description, in one print head 30 (the actuator module 40), the ink having the same color is commonly stored over the 2 m nozzles N.

The compliance portion 64 is an element that constitutes a bottom surface of the liquid storage chamber Sr and suppresses (absorbs) a change in the pressure of the ink in the liquid storage chamber Sr and an internal flow channel. The compliance portion 64 includes, for example, a flexible member formed in a sheet shape. In detail, the compliance portion 64 is fixed to the surface of the flow channel substrate 42 to block the opening portion 422 and each supply flow channel 424 in the flow channel substrate 42.

The diaphragm 46 is installed on the surface of the pressure chamber substrate 44 opposite to the flow channel substrate 42. The diaphragm 46, which is an elastically vibratable flat plate member, is configured by a lamination of an elastic film formed of an elastic material such as silicon oxide and an insulating film formed of an insulating material such as zirconium oxide. The diaphragm 46 and the flow channel substrate 42 face each other inside each opening portion 442 of the pressure chamber substrate 44 with a space therebetween. The space interposed between the flow channel substrate 42 and the diaphragm 46 inside each opening 442 functions as a pressure chamber Sc that applies a pressure to the ink. Each pressure chamber Sc communicates with the nozzles N through the communication flow channel 426 of the flow channel substrate 42.

A piezoelectric element Pzt corresponding to the nozzle N (the pressure chamber Sc) is formed on the surface of the diaphragm 46 opposite to the pressure chamber substrate 44.

The piezoelectric element Pzt includes a driving electrode 72 individually formed in each piezoelectric element Pzt on the surface of the diaphragm 46, a piezoelectric body 74 formed on the surface of the driving electrode 72, and a common driving electrode 76 formed on the piezoelectric body 74. A region where the driving electrodes 72 and 76 are opposite to each other with the piezoelectric body 74 interposed therebetween functions as the piezoelectric element Pzt.

The piezoelectric body 74 is formed by a process including, for example, heat treatment (baking). In detail, the piezoelectric body 74 is formed by baking a piezoelectric material applied onto the surface of the diaphragm 46 on which a plurality of the driving electrodes are formed, by the heat treatment in a baking furnace, and then shaping (for example, milling using plasma) the baked piezoelectric material in each piezoelectric element Pzt.

A part of the driving electrode 72 is exposed from the sealing body 52 and the support body 54, and one end of a wiring substrate 34 is fixed to the exposed part through an adhesive.

A not-illustrated semiconductor chip is mounted on the wiring substrate 34 obtained by patterning a plurality of wirings 344 on an insulating and flexible base film 342 formed of polyimide. The IC module is configured in a state in which the semiconductor chip is mounted on the wiring substrate 34.

Further, the driving electrode 72 is electrically connected to the wirings 344 of the wiring substrate 34, and a driving signal Vout, which will be described below, is individually applied to one end of the piezoelectric element Pzt through this connection.

Meanwhile, although not illustrated in detail in FIG. 4, the driving electrode 76 is commonly connected over a plurality of the piezoelectric elements Pzt, is drawn from the sealing body 52 and the support body 54 to the exposed portion, and is electrically connected to another wiring 344 of the wiring substrate 34. A voltage VBS, which will be described below, is commonly applied to the other ends of the plurality of piezoelectric elements Pzt through this connection.

A central portion of the piezoelectric element Pzt having such a configuration with respect to a periphery thereof in FIG. 4 is bent upward or downward with respect to opposite ends of the piezoelectric element Pzt according to the voltage applied by the driving electrodes 72 and 76 together with the driving electrodes 72 and 76 and the diaphragm 46. In detail, in the present embodiment, when the voltage applied to the piezoelectric element Pzt (the voltage of the driving signal Vout with respect to the voltage VBS) is low, the central portion is bent upward. As the applied voltage increases, the piezoelectric element Pzt gradually goes to a flat shape, and when the applied voltage further increases, the central portion is bent downward.

Here, since the internal volume of the pressure chamber Sc is enlarged when the central portion is bent upward, the ink is withdrawn from the liquid storage chamber Sr. Meanwhile, since the internal volume of the pressure chamber Sc is reduced when the central portion is bent downward, ink droplets are ejected from the nozzles N depending on a degree of the reduction.

In this way, when an appropriate driving signal is applied to the piezoelectric element Pzt, the ink is ejected from the nozzles N by the displacement of the piezoelectric element Pzt.

Figure 5:
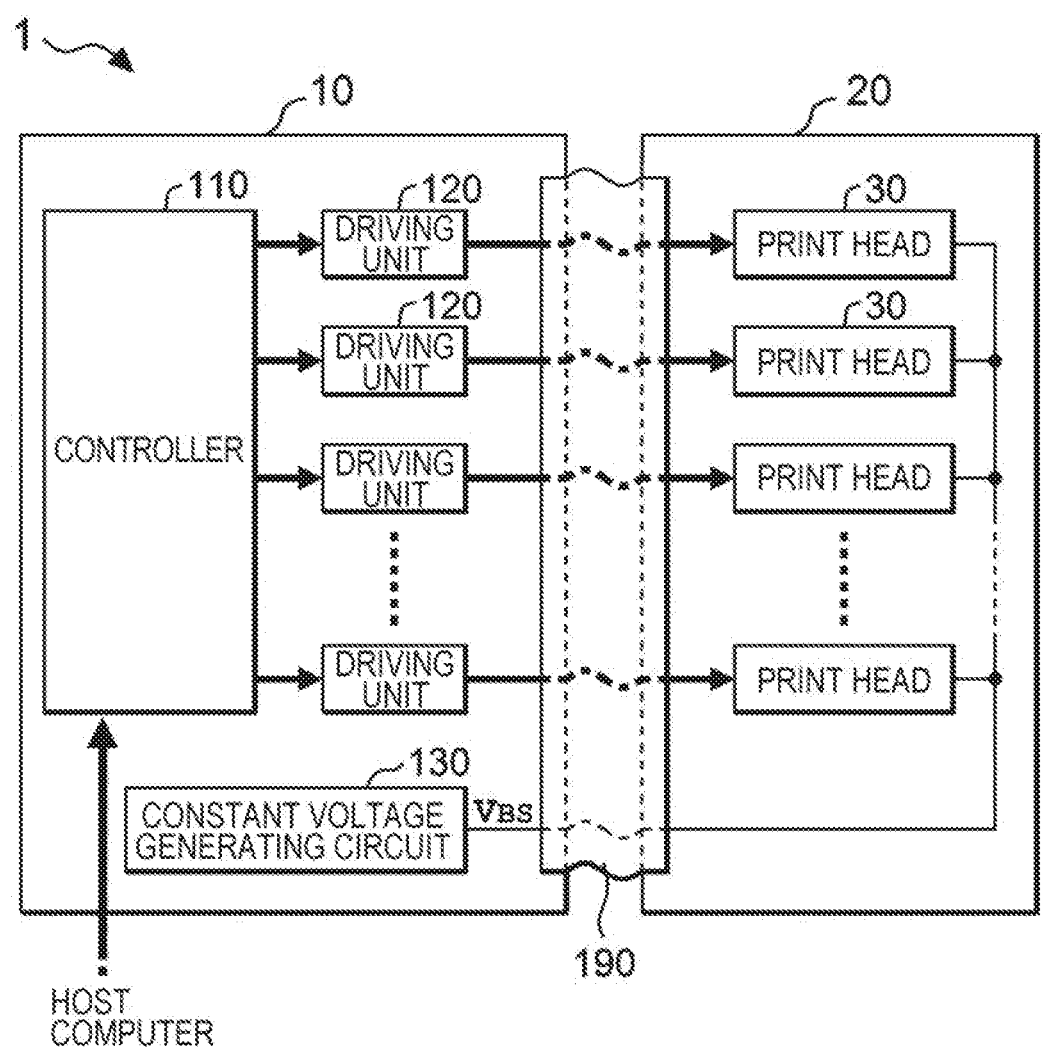
FIG. 5 is a block diagram illustrating an electric configuration of the ink jet printer.

FIG. 5 is a block diagram illustrating an electric configuration of the ink jet printer 1.

As illustrated in the drawing, in the ink jet printer 1, the head module 20 is connected to the control module 10 through the FFC 190.

The control module 10 includes a controller 110, a plurality of driving units 120, and a constant voltage generating circuit 130.

When the image data to be printed is supplied from the host computer or the like, the controller 110, which is a kind of microcomputer having a central processing unit (CPU), a random access memory (RAM), and a read-only memory (ROM), executes a predetermined program, and outputs various control signals and the like for controlling each unit.

The driving units 120 are provided in, for example, the print heads 30, respectively.

The constant voltage generating circuit 130 generates a constant voltage signal of the voltage VBS, and supplies the generated constant voltage signal to the head module 20 through the FFC 190.

Although the controller 110 outputs a signal for controlling the transport mechanism 80 and the moving mechanism 90, a configuration for the control will be omitted because the configuration is already known.

In the ink jet printer 1, a plurality of sets of the driving units 120 and the print heads 30 are independently controlled according to main scanning of the carriage 18 by the moving mechanism 90 and sub-scanning of the medium P by the transport mechanism 80.

There is no difference other than the color of the ink to be ejected and an ejection timing in an operation of the plurality of sets. Thus, next, for the sake of convenience, one set of the driving unit 120 and the print head 30 will be mainly described.

Figure 6:
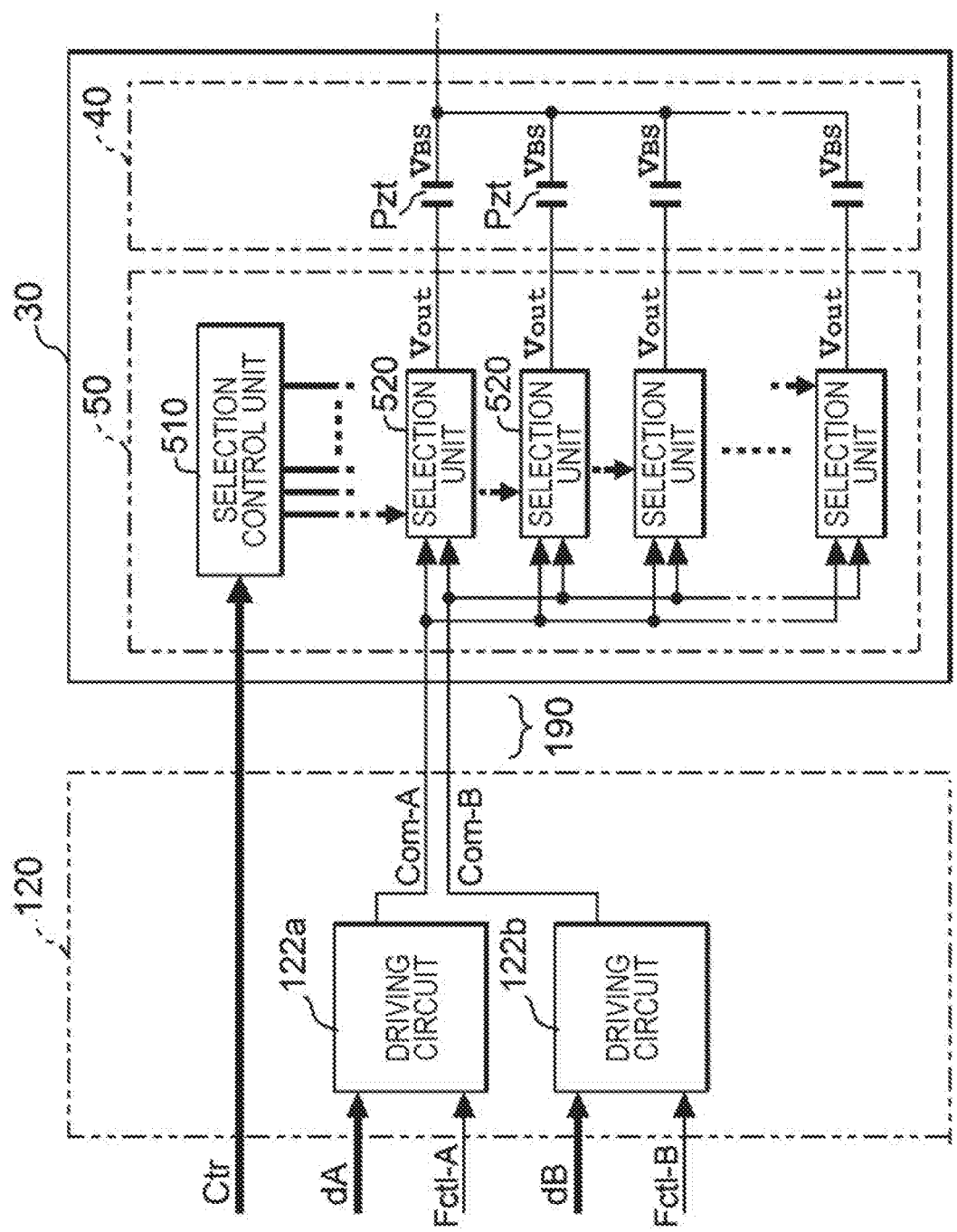
FIG. 6 is a block diagram illustrating configurations of a driving unit and a print head.

FIG. 6 is a block diagram illustrating a configuration of one set of the driving unit 120 and the print head 30.

The driving unit 120 includes driving circuits 122a and 122b.

As will be described in detail below, the driving circuit 122a generates a driving signal Com-A based on data dA and a signal Fctl-A supplied from the controller 110. The data dA digitally regulates the voltage of the driving signal Com-A which is a trapezoidal waveform, and the signal Fctl-A is, for example, in a level L when the voltage of the driving signal Com-A is raised or lowered, and is in a level H in a state in which the voltage of the driving signal Com-A is temporally constant (including a state in which the voltage is regarded as substantially constant).

The driving circuit 122b generates a driving signal Com-B based on data dB and a signal Fctl-B supplied from the controller 110. The data dB digitally regulates the voltage of the driving signal Com-B which is a trapezoidal waveform, and the signal Fctl-B is, for example, in a level L when the voltage of the driving signal Com-B is raised or lowered, and is in a level H in a state in which the voltage of the driving signal Com-B is temporally constant.

The driving signal Com-A generated by the driving circuit 122a, the driving signal Com-B generated by the driving circuit 122b, and a control signal Ctr supplied from the controller 110 is supplied to the print head 30 via the FFC 190. The control signal Ctr includes a printing signal SI, a signal LAT, a signal CH, a clock signal, and the like.

Among them, the printing signal SI is data that regulates the size of a dot formed by ejecting the ink according to each nozzle N. In the present embodiment, in one nozzle N, the size of the dot is regulated in four gradations including a large dot, a middle dot, a small dot, and a non-recorded dot (no dot). Therefore, it will be described that the printing signal SI has a two-bit gradation for each nozzle N.

Further, the signals LAT and CH are signals for regulating a control period and a timing of printing in the print head 30.

The print head 30 includes the actuator module 40 and the IC module 50. The IC module 50 has a selection control unit 510 and selection units 520 corresponding to the piezoelectric elements Pzt, respectively.

Among them, the selection control unit 510 controls selection of each of the selection units 520. In detail, the selection control unit 510 temporarily accumulates the printing signal SI supplied from the controller 110 in synchronization of the clock signal, by 2 m which is the number of the nozzles N (the piezoelectric elements Pzt) in the print head 30, and selects the driving signal Com-A or Com-B according to the accumulated printing signal SI, for each control period of the printing, which is regulated by the signals LAT and CH with respect to each selection unit 520.

The selection unit 520 selects one of the driving signals Com-A and Com-B (or selects none thereof) according to an instruction from the selection control unit 510 and applies the selected driving signal to one end (the driving electrode 72, see FIG. 4) of the piezoelectric element Pzt in the actuator module 40. Vout denotes the voltage of the driving signal selected by the selection unit 520 and applied to the one end of the piezoelectric element Pzt.

In this way, the driving signals Com-A and Com-B are applied to the one end of the piezoelectric element Pzt through a wiring, a circuit, or the like in the FFC 190, the IC module 50, and the actuator module 40.

As described above, in the actuator module 40, one piezoelectric element Pzt is provided in each nozzle N. The driving electrode 76, which corresponds to the other end of each piezoelectric element Pzt, are commonly connected, and the voltage VBS generated by the constant voltage generating circuit 130 is commonly applied to the other end.

In the present embodiment, one dot is generated by ejecting the ink from one nozzle N at most twice, and is expressed in the four gradations including the large dot, the middle dot, the small dot, and the non-recorded dot. In the present embodiment, in order to express the four gradations, the two kinds of driving signals Com-A and Com-B are prepared, and one cycle of the driving signals Com-A and Com-B are divided into a first half period and a second half period. Thus, during the one cycle, the driving signal Com-A or Com-B is selected (or is not selected) in the first half period or the second half period according to the gradation to be expressed, and is applied to the one end of the piezoelectric element Pzt.

Next, the driving signals Com-A and Com-B will be described, and then the driving circuit 122a (122b) that generates the driving signal Com-A (Com-B) will be described in detail.

Figure 9:
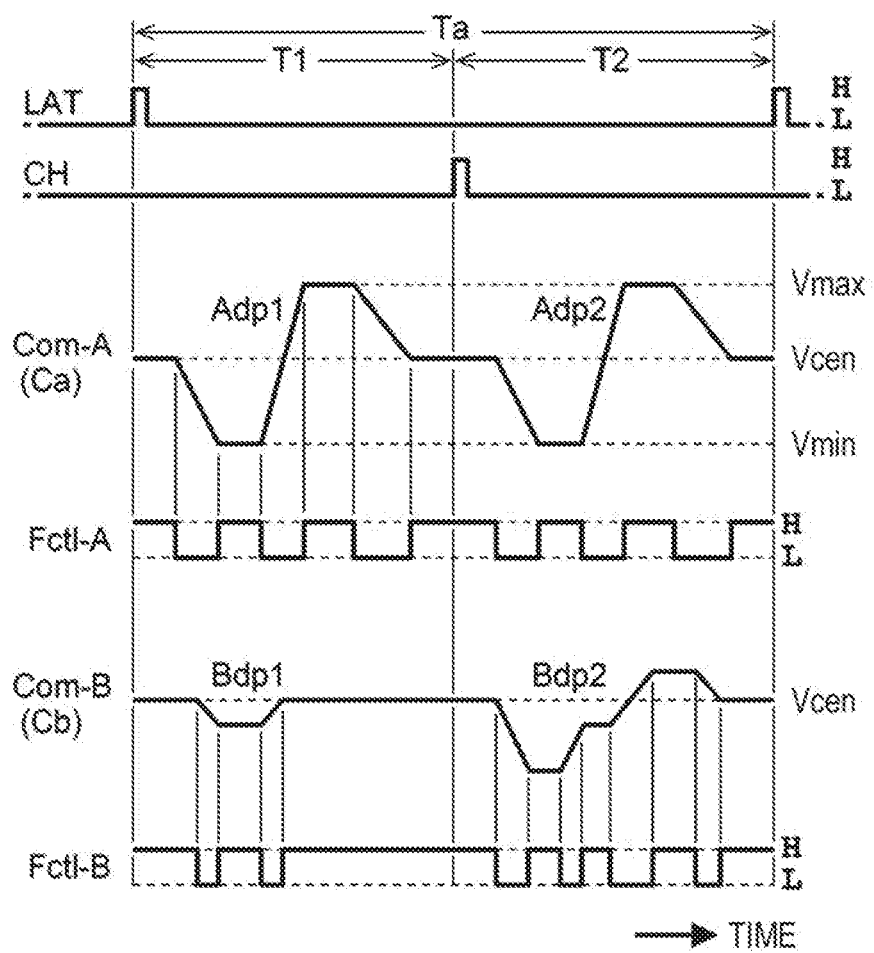
FIG. 9 is a timing chart for illustrating an operation of the driving circuit.

FIG. 9 is a diagram illustrating waveforms of the driving signals Com-A and Com-B. Since the voltage of the driving signal Com-A (Com-B) actually generated by the driving circuit 122a (122b) oscillates as will be described below, the waveform expressed herein is ideal.

As illustrated in FIG. 9, the driving signal Com-A has a waveform in which a trapezoidal waveform Adp1 arranged in a control period T1 from output of the signal LAT to output of the signal CH during a printing period Ta and a trapezoidal waveform Adp2 arranged in a control period T2 from the output of the signal CH to the output of the next signal LAT during the printing period Ta are repeated.

The trapezoidal waveform Adp1 and the trapezoidal waveform Adp2 have substantially the same, and when each of the trapezoidal waveform Adp1 and the trapezoidal waveform Adp2 is applied to the driving electrode 72 which is the one end of the piezoelectric element Pzt, a middle amount of the ink is ejected from the nozzle N corresponding to the piezoelectric element Pzt.

The driving signal Com-B has a waveform in which a trapezoidal waveform Bdp1 arranged in the control period T1 and a trapezoidal waveform Bdp2 arranged in the control period T2 are repeated.

The trapezoidal waveforms Bdp1 and Bdp2 are different from each other. Among them, the trapezoidal waveform Bdp1 is a waveform in which the ink slightly vibrates near the nozzle N to prevent the viscosity of the ink from increasing. Therefore, even when the trapezoidal waveform Bdp1 is applied to the one end of the piezoelectric element Pzt, the ink droplets are not ejected from the nozzle N corresponding to the piezoelectric element Pzt. Further, the trapezoidal waveform Bdp2 is a waveform in which when the trapezoidal waveform Bdp2 is applied to the one end of the piezoelectric element Pzt, a small amount of the ink that is less than the middle amount is ejected from the nozzle N corresponding to the piezoelectric element Pzt.

The middle amount and the small amount mentioned here are relative concepts, and the amount of the ink is not defined by an absolute value.

The voltage of the trapezoidal waveforms Adp1, Adp2, Bdp1, and Bdp2 at a start timing and the voltage thereof at an end timing are commonly a voltage VCen. That is, each of the trapezoidal waveforms Adp1, Adp2, Bdp1, and Bdp2 is a waveform that starts at the voltage VCen and ends at the voltage VCen.

Further, for convenience, Vmax denotes the maximum value of the voltage of the trapezoidal waveforms Adp1 and Adp2, and Vmin denotes the minimum value of the voltage of the trapezoidal waveforms Adp1 and Adp2.

When formation of the large dot is designated for a certain nozzle N by the printing signal SI, the selection control unit 510 controls the selection unit 520 corresponding to the nozzle N, to select the driving signal Com-A in the control period T1 and the control period T2. When the trapezoidal waveform Adp1 and the trapezoidal waveform Adp2 selected by this control are applied to the one end of the piezoelectric element Pzt, the middle amount of the ink is ejected twice from the nozzle N corresponding to the piezoelectric element Pzt. Therefore, the ink collides with and is combined on the medium P, and as a result, the large dot is formed on the medium P as regulated by the printing signal SI.

When formation of the middle dot is designated for a certain nozzle N by the printing signal SI, for example, the selection control unit 510 controls the selection unit 520 corresponding to the nozzle N to select the driving signal Com-A in the control period T1 and to select the driving signal Com-B in the subsequent control period T2. When the trapezoidal waveform Adp1 and the trapezoidal waveform Bdp2 selected by this control are applied to the one end of the piezoelectric element Pzt, the middle amount of the ink and the small amount of the ink are ejected twice from the nozzle N corresponding to the piezoelectric element Pzt. Therefore, the ink collides with and is combined on the medium P, and as a result, the middle dot is formed on the medium P as regulated by the printing signal SI.

When formation of the small dot is designated for a certain nozzle N by the printing signal SI, the selection control unit 510 controls the selection unit 520 corresponding to the nozzle N, so as not to select both the driving signal Com-A and the driving signal Com-B in the control period T1 and to select the driving signal Com-B in the subsequent control period T2. When only the trapezoidal waveform Bdp2 selected by this control is applied to the one end of the piezoelectric element Pzt, the small amount of the ink is ejected once from the nozzle N corresponding to the piezoelectric element Pzt. Therefore, as a result, the small dot is formed on the medium P as regulated by the printing signal SI.

When neither the driving signal Com-A nor the driving signal Com-B is selected, the one end of the piezoelectric element Pzt is electrically disconnected. However, since the voltage (VCen-VBS) of the piezoelectric element Pzt is held due to a capacitance thereof, the piezoelectric element Pzt does not have a negative voltage.

When the non-recorded dot is designated for a certain nozzle N by the printing signal SI, for example, the selection control unit 510 controls the selection unit 520 corresponding to the nozzle N to select the driving signal Com-B in the control period T1 and to select neither the driving signal Com-A nor the driving signal Com-B in the subsequent control period T2. When only the trapezoidal waveform Bdp1 is applied to the one end of the piezoelectric element Pzt by this control, the ink near the nozzle N merely vibrates slightly, and the ink is not ejected. As a result, the non-recorded dot is formed as regulated by the printing data SI.

The fact that the controller 110 outputs the signals Fctl-A and Fctl-B at the above-described logic level is as described above.

Next, the driving circuits 122a and 122b will be described in detail.

Figure 7:
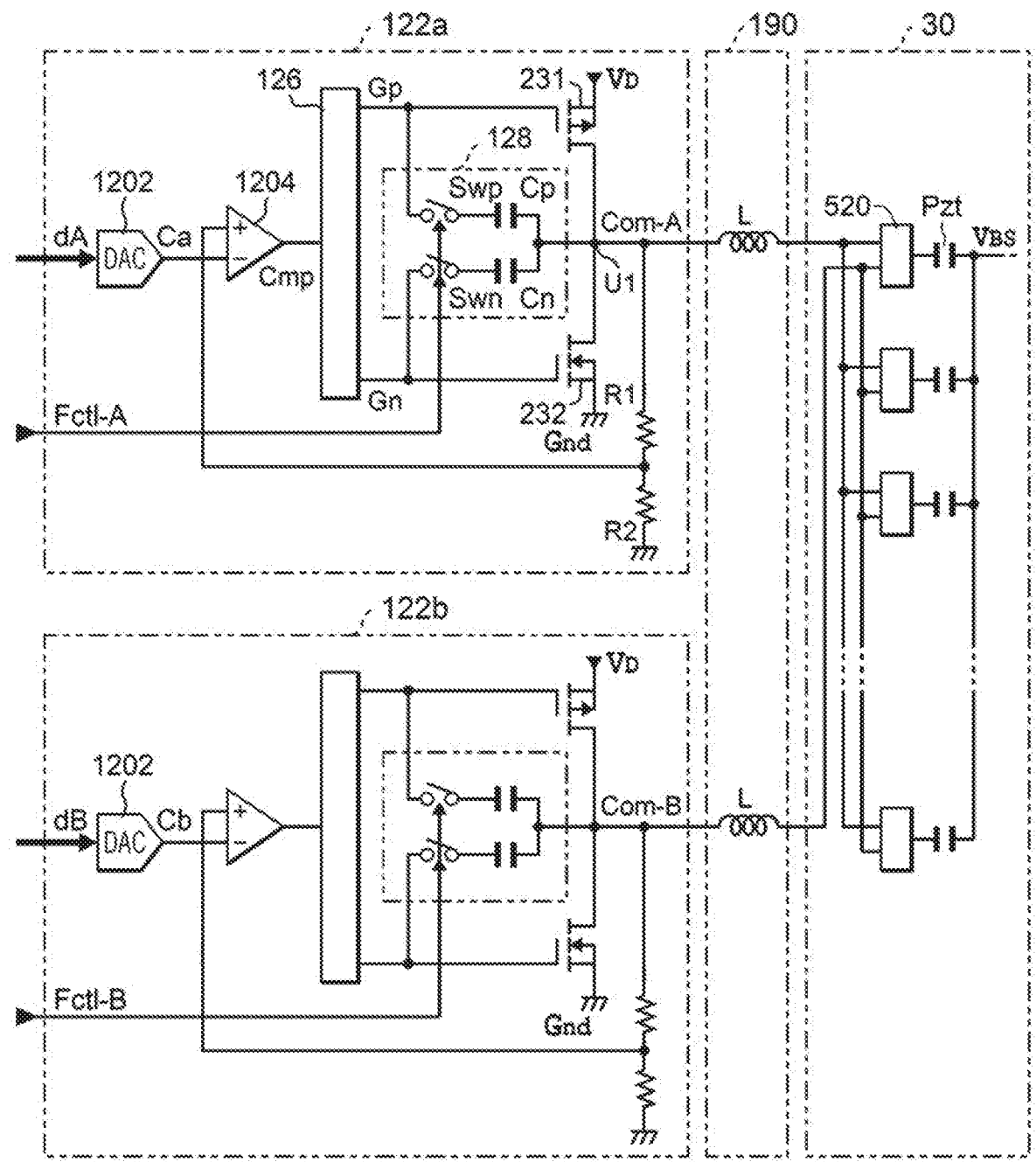
FIG. 7 is a diagram illustrating a configuration of a driving circuit.

FIG. 7 is a diagram illustrating configurations of the driving circuits 122a and 122b, and the like.

As illustrated in this drawing, the driving circuit 122a includes a digital to analog converter (DAC) 1202, a comparator 1204, a control signal generating circuit 126, an adjustment circuit 128, a high side transistor 231, a low side transistor 232, and resistive elements R1 and R2.

The DAC 1202 converts the data dA supplied from the controller 110 into an analog original driving signal Ca. Here, the driving circuit 122a amplifies the voltage of the original driving signal Ca by ten times, and outputs the amplified signal as the driving signal Com-A from a node U1.

The original driving signal Ca is supplied to a negative input terminal (−) of the comparator 1204. A signal obtained by stepping down the driving signal Com-A by one tenth which is an inverse ratio of the voltage amplification ratio by the resistive elements R1 and R2 is fed back to a positive input terminal (+) of the comparator 1204. That is, a signal obtained by stepping down the voltage of the driving signal Com-A outputted from the note U1 by one tenth is fed back to the positive input terminal (+) of the comparator 1204 as a feedback signal.

The comparator 1204 outputs a level H signal Cmp when the voltage of the positive input terminal (+) is equal to or more than the voltage of the negative input terminal (−), and outputs a level L signal Cmp when the voltage of the positive input terminal (+) is less than the voltage of the negative input terminal (−).

As will be described below in detail, the control signal generating circuit 126 generates a gate signal Gn (a first control signal) Gp that controls a switching operation of the transistor 231 and a gate signal (a second control signal) that controls a switching operation of the transistor 232, based on the signal Cmp.

A transistor pair is formed with the transistor (a first transistor) 231 and the transistor (a second transistor) 232. Among them, the high side transistor 231 is, for example, a P-channel type field effect transistor, a high side voltage $V_D$ of a power source is applied to a source terminal thereof, and the gate signal Gp is supplied to a gate terminal thereof. The low side transistor 232 is, for example, an N-channel field effect transistor, a gate signal Gn is supplied to a gate terminal thereof, and a source terminal thereof is grounded to the ground Gnd which is a lower side of the power source.

Drain terminals of the transistors 231 and 232 are connected to the node U1, and the driving signal Com-A is output from the node U1.

The adjustment circuit 128 is provided between the control signal generating circuit 126 and the transistors 231 and 232, and includes switches Swp and Swn and capacitors Cp and Cn. Both the switches Swp and Swn between ends and the other ends thereof are switched on (becomes a conducting state) when the signal Fctl-A is in the level H, and are switched off (becomes a non-conducting state) when the signal Fctl-A is in the level L. In the switch Swp, the one end thereof is connected to the gate terminal of the transistor 231, and the other end thereof is connected to one end of the capacitor Cp (a first capacitor). The other end of the capacitor Cp is connected to the node U1. In the switch Swn, the one end thereof is connected to the gate terminal of the transistor 232, and the other end thereof is connected to one end of the capacitor Cn (a second capacitor). The other end of the capacitor Cn is connected to the node U1.

In the adjustment circuit 128, when the signal Fctl-A is in the level H, the switch Swp is switched on so that the one end of the capacitor Cp is electrically connected to the gate terminal of the transistor 231, and the switch Swn is switched on so that the one end of the capacitor Cn is electrically connected to the gate terminal of the transistor 232.

Meanwhile, in the adjustment circuit 128, when the signal Fctl-A is in the level L, the switch Swp is switched off so that the one end of the capacitor Cp is electrically isolated (disconnected) from the gate terminal of the transistor 231, and the switch Swn is switched off so that the one end of the capacitor Cn is electrically isolated from the gate terminal of the transistor 232.

That is, the capacitor Cp is an element that is provided between the gate terminal and the drain terminal of the transistor 231 to be switched between electrical connection or electrical disconnection according to the signal Fctl-A, and the capacitor Cn is an element that is provided between the gate terminal and the drain terminal of the transistor 232 to be switched between electrical connection or electrical disconnection according to the signal Fctl-A.

Since the highest voltage of the driving signal Com-A is, for example, 40 V (volt), the high side voltage $V_D$ of the power source of the transistor pair is, for example, about 42 V.

Therefore, although a power source of the comparator 1204 and the control signal generating circuit 126 is not particularly illustrated in FIG. 7, a high voltage side is the voltage $V_D$.

Further, as described above, since the driving circuit 122a amplifies the voltage of the original driving signal Ca by ten times and outputs the amplified signal as the driving signal Com-A, the voltage of the original driving signal Ca ranges from 0 V to 4.2 V.

The driving circuit 122b is the same as the driving circuit 122a except for the supplied signal and the output signal. In detail, the driving circuit 122b converts the data dB supplied from the controller 110 into an analog original driving signal Cb by the DAC 1202, amplifies the voltage of the original driving signal Cb by ten times, and outputs the amplified signal as the driving signal Com-B.

Although the driving signal Com-A from the driving circuit 122a and the driving signal Com-B from the driving circuit 122b are supplied to the print head 30 through the FFC 190, in FIG. 7, the parasitic inductance of the FFC 190 or the like is expressed as L.

Figure 8:
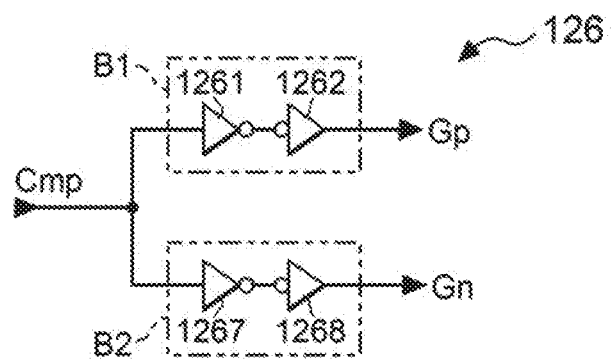
FIG. 8 is a diagram illustrating an example of a configuration of a control signal generating circuit.

FIG. 8 is a diagram illustrating an example of a configuration of the control signal generating circuit 126 of the driving circuit 122a. As illustrated in FIG. 8, the control signal generating circuit 126 has two buffer circuits B1 and B2. The buffer circuit B1 includes an inverter (NOT circuit) 1261 that inverts the signal Cmp from the comparator 1204 and an inverter 1262 that re-inverts the signal inverted by the inverter 1261 and outputs the re-inverted signal as the gate signal Gp, and the buffer circuit B2 includes an inverter 1267 that inverts the signal Cmp and an inverter 1268 that re-inverts the signal inverted by the inverter 1267 and outputs the re-inverted signal as the gate signal Gn.

Each of the buffer circuits B1 and B2 performs an operation (buffering) of outputting a logic signal having the same level as the level of the signal Cmp which is an input. However, the buffer circuits B1 and B2 have different switched references (thresholds) of the voltage to have the same logic level with respect to a change in the voltage of the signal Cmp.

Figure 10:
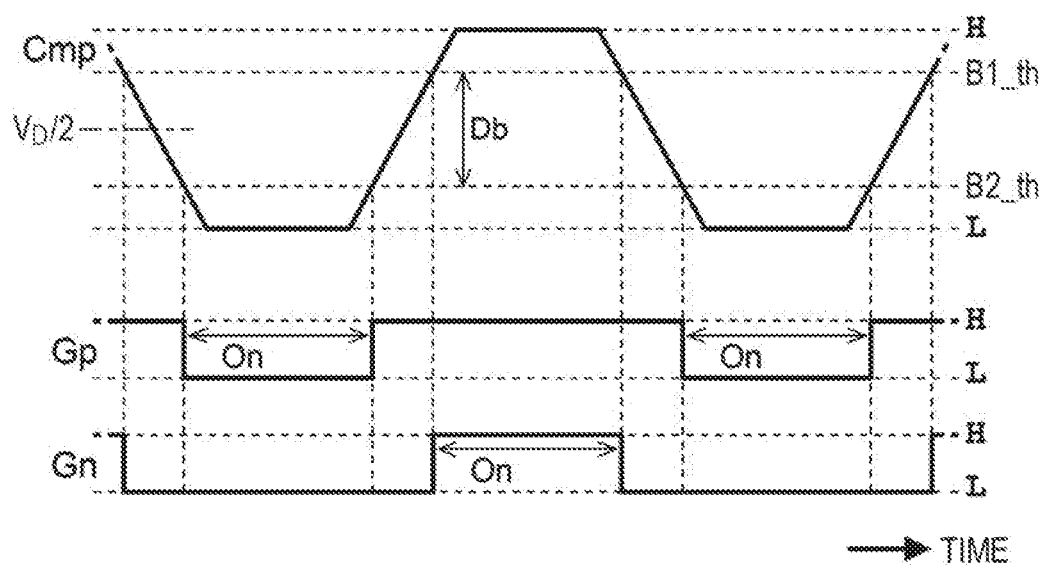
FIG. 10 is a timing chart for illustrating an operation of the control signal generating circuit.

FIG. 10 is a diagram illustrating how the levels of the gate signals Gp and Gn change with respect to the change in the voltage of the signal Cmp. In FIG. 10, a horizontal axis is defined as time.

In FIG. 10, B1_th is a threshold in the buffer circuit B1, and B2_th is a threshold in the buffer circuit B2.

In the present embodiment, a relationship between the thresholds is set as follows.

B2_th<B1_th is satisfied.

If the threshold is set in this manner, when the signal Cmp gradually decreases from the voltage $V_D$ corresponding to the level H to the ground Gnd (a voltage zero) corresponding to the level L, the gate signal Gn changes from the level H to the level L earlier than the gate signal Gp. In contrast, when the signal Cmp gradually increases from the voltage zero corresponding to the level L to the voltage $V_D$ corresponding to the level H, the gate signal Gp changes from the level L to the level H earlier than the gate signal Gn.

The transistor 231 is switched on when the gate signal Gp is in the level L, and the transistor 232 is switched off when the gate signal Gn is in the level H.

Therefore, when the signal Cmp gradually decreases from the level H to the level L, the gate signal Gn becomes the level L, and the transistor 232 is switched off. Thereafter, the gate signal Gp becomes the level L, and the transistor 231 is switched on. Meanwhile, when the signal Cmp gradually increases from the level L to the level H, the gate signal Gp becomes the level H, and the transistor 232 is switched off. Thereafter, the gate signal Gn becomes the level H, and the transistor 231 is switched on.

Therefore, in the present embodiment, when the voltage of the signal Cmp changes, after one of the transistors 231 and 232 is switched from an ON state to an OFF state, the other one of the transistors 231 and 232 is switched from an OFF state to an ON state, and the transistors 231 and 232 are not simultaneously switched on.

In other words, when the logic level of the signal Cmp changes, both the transistors 231 and 232 may be switched off. A state in which both the transistors 231 and 232 are switched off means that the voltage of the node U1 (the voltage of the driving signal Com-A) is not controlled both in an ascending direction and a descending direction. Therefore, a range of the voltage of the signal Cmp in which both of the transistors 231 and 232 are turned off is referred to as a dead zone (or a dead band) in a sense that the voltage of the driving signal Com-A is not (cannot be) controlled.

In the present embodiment, since the transistors 231 and 232 are not simultaneously switched off, a through-current is prevented from flowing.

FIG. 10 is a diagram for illustrating how the levels of the gate signals Gp and Gn change with respect to the change in the voltage of the signal Cmp with the horizontal axis as time. In the present embodiment, it is not meant that the signal Cmp actually changes as illustrated in the figure.

Further, in the case of the control signal generating circuit 126, the gate signals Gp and Gn may be output with respect to the change in the voltage of the signal Cmp in a relationship illustrated in FIG. 10. Therefore, the control signal generating circuit 126 may have a configuration other than the configuration illustrated in FIG. 8.

For example, the signal Cmp may be input to a complementary OR circuit and a complementary AND circuit, output of the OR circuit may be the gate signal Gp, and output of the AND circuit may be the gate signal Gn. As is well known, the complementary OR circuit is obtained by adding a NOR circuit and a NOT circuit, and among them, the NOR circuit has a parallel portion of a transistor. Further, the complementary AND circuit is obtained by adding a NAND circuit and a NOT circuit, and among them, the NAND circuit has a serial portion of the transistor. Since an ON resistance of the parallel portion of the transistor is lower than an ON resistance of the series portion of the transistor, a threshold of the OR circuit is higher than a threshold of the AND circuit. Therefore, as a result, since the thresholds have the same relationship illustrated in FIG. 10, the gate signals Gp and Gn are outputted with respect to the change in the voltage of the signal Cmp in the relationship illustrated in the same figure.

Figure 11:
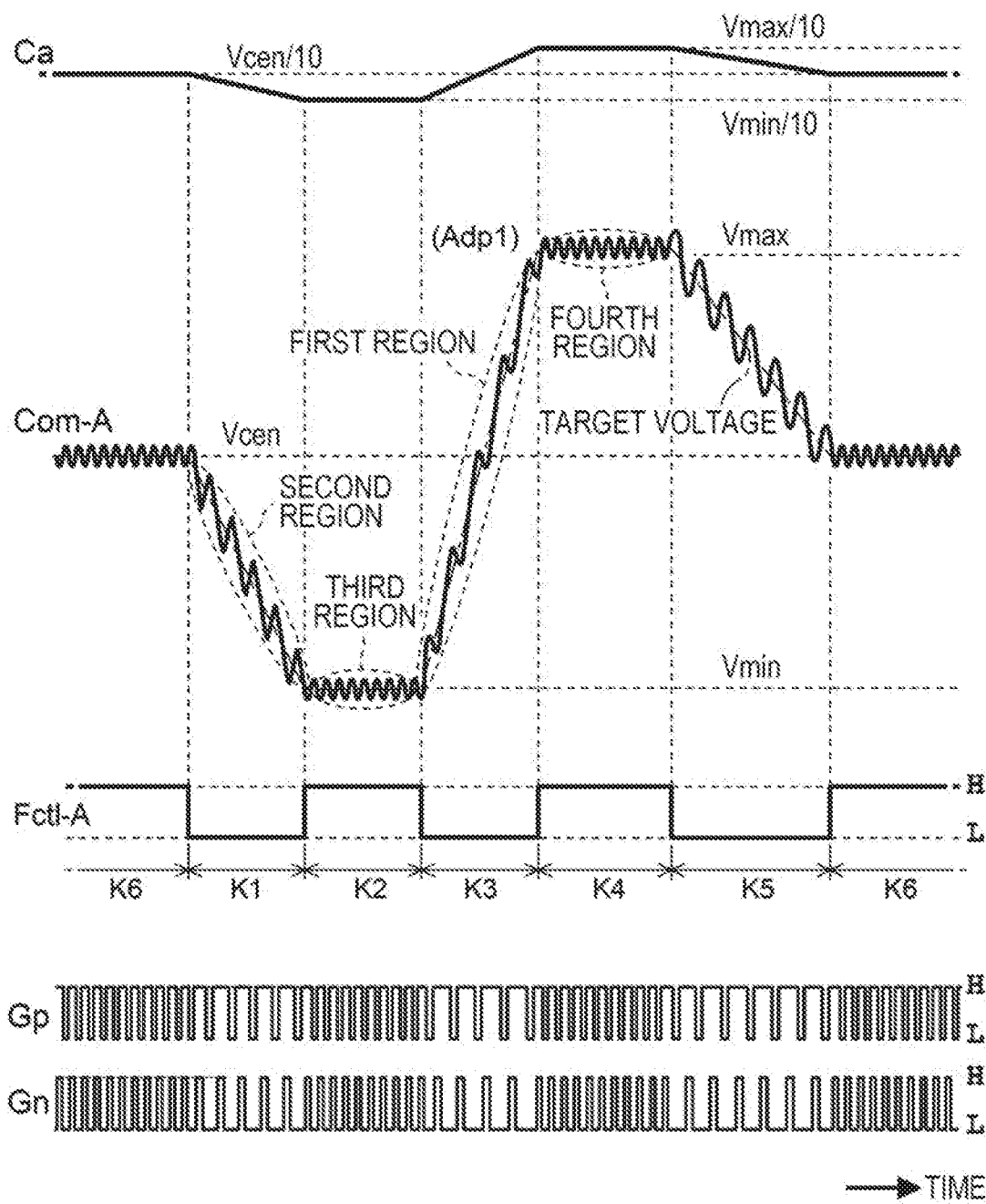

FIG. 11 is a diagram illustrating a voltage waveform in each unit for illustrating an operation of the driving circuit 122a.

As described above, since the driving signal Com-A (the original driving signal Ca) is a waveform in which the two same trapezoidal waveforms Adp1 and Adp2 are repeated in the printing period Ta, the trapezoidal waveform Adp1 will be described as a representative. Further, since the driving signal Com-A has a relationship in which the voltage of the original driving signal Ca is amplified by ten times, the voltages VCen, Vmax, and Vmin of the driving signal Com-A correspond to voltages VCen/10, Vmax/10, and Vmin/10 of the original driving signal Ca, respectively.

In FIG. 11, a period K1 is a period during which the voltage of the original driving signal Ca decreases from the voltage VCen/10 to the voltage Vmin/10, a period K2 following the period K1 is a period during which the voltage of the original driving signal Ca is constant at the voltage Vmin/10, and a period K3 following the period K2 is a period during which the voltage of the original driving signal Ca increases from the voltage Vmin/10 to the voltage Vmax/10. Further, a period K4 following the period K3 is a period during which the voltage of the original driving signal Ca is constant at the voltage Vmax/10, a period K5 following the period K4 is a period during which the voltage of the original driving signal Ca decreases from the voltage Vmax/10 to the voltage VCen/10, and a period K6 following the period K5 is a period during which the voltage of the original driving signal Ca is constant at the voltage VCen/10.

First, the period K1 is a period during which the voltage of the original driving signal Ca decreases.

Here, it is assumed that a voltage obtained by dividing the voltage of the driving signal Com-A by 10, that is, a voltage of the feedback signal, is lower than the voltage of the original driving signal Ca. In this assumption, since the signal Cmp is at the level L, the gate signal Gp and Gn are also in the level L. Therefore, since the transistor 231 is switched on and the transistor 232 is switched off, a control of increasing the voltage of the driving signal Com-A is executed.

As a result of the control of increasing the voltage of the driving signal Com-A, while the voltage of the feedback signal becomes higher than the voltage of the original driving signal Ca, the signal Cmp increases from the level L to the level H. In this increasing process, as described above, after the gate signal Gp becomes the level H and the transistor 231 is switched off, since the gate signal Gn becomes the level H and the transistor 232 is switched off, at this time, a control of decreasing the voltage of the driving signal Com-A is executed.

As a result of the control of decreasing the voltage of the driving signal Com-A, while the voltage of the feedback signal becomes lower than the voltage of the original driving signal Ca, the signal Cmp decreases from the level L to the level H. In this decreasing process, as described above, after the gate signal Gn becomes the level L and the transistor 232 is switched off, since the gate signal Gp becomes the level L and the transistor 231 is switched off, the control of increasing the voltage of the driving signal Com-A is executed again.

As a result, in the period K1, the transistors 231 and 232 are alternately and repeatedly switched on, so that the voltage of the feedback signal is controlled to follow the decrease in the voltage of the original driving signal Ca. As a result of such control, in the period K1, the voltage of the driving signal Com-A decreases to a target voltage that is 10 times larger than the voltage of the original driving signal Ca while oscillating.

The period K2 is a period during which the original driving signal Ca is constant at the voltage Vmin/10.

When the voltage of the feedback signal is less than the voltage of the original driving signal Ca, since the signal Cmp becomes the level L, both the gate signals Gp and Gn become the level L. Therefore, since the transistor 231 is switched on and the transistor 232 is switched off, a control of increasing the voltage of the driving signal Com-A is executed.

Due to the control of increasing the voltage of the driving signal Com-A, while the voltage of the feedback signal becomes higher than the voltage of the original driving signal Ca, the signal Cmp increases from the level L to the level H. In this increasing process, as described above, after the gate signal Gp becomes the level H and the transistor 231 is switched off, since the gate signal Gn becomes the level H and the transistor 232 is switched off, at this time, a control of decreasing the voltage of the driving signal Com-A is executed.

Due to the control of decreasing the voltage of the driving signal Com-A, while the voltage of the feedback signal becomes lower than the voltage of the original driving signal Ca, the signal Cmp decreases from the level L to the level H. In this decreasing process, after the gate signal Gn becomes the level L and the transistor 232 is switched off, since the gate signal Gp becomes the level L and the transistor 231 is switched off, the control of increasing the voltage of the driving signal Com-A is executed again.

As a result, in the period K2, the transistors 231 and 232 are alternately and repeatedly switched on, so that the voltage of the feedback signal is controlled to be constant at the voltage Vmin/10 of the original driving signal Ca. As a result of such control, in the period K2, the voltage of the driving signal Com-A is kept approximately at a target voltage Vmin while oscillating.

The period K3 is a period during which the voltage of the original driving signal Ca increases.

Here, when the voltage of the feedback signal is less than the voltage of the original driving signal Ca, since the signal Cmp becomes the level L, both the gate signals Gp and Gn become the level L. Therefore, since the transistor 231 is switched on and the transistor 232 is switched off, a control of increasing the voltage of the driving signal Com-A is executed.

As a result of the control of increasing the voltage of the driving signal Com-A, while the voltage of the feedback signal becomes higher than the voltage of the original driving signal Ca, the signal Cmp increases from the level L to the level H. In this increasing process, after the gate signal Gp becomes the level H and the transistor 231 is switched off, since the gate signal Gn becomes the level H and the transistor 232 is switched off, at this time, a control of decreasing the voltage of the driving signal Com-A is executed.

As a result of the control of decreasing the voltage of the driving signal Com-A, while the voltage of the feedback signal becomes lower than the voltage of the original driving signal Ca, the signal Cmp decreases from the level L to the level H. In this decreasing process, after the gate signal Gn becomes the level L and the transistor 232 is switched off, since the gate signal Gp becomes the level L and the transistor 231 is switched off, the control of increasing the voltage of the driving signal Com-A is executed again.

As a result, in the period K3, the transistors 231 and 232 are alternately and repeatedly switched on, so that the voltage of the feedback signal is controlled to increase in the voltage of the original driving signal Ca. As a result of such control, in the period K3, the voltage of the driving signal Com-A increases to a target voltage while oscillating.

Since the period K4 is a period during which the original driving signal Ca is constant at the voltage Vmax/10, there is no difference between the operation of the period K2 and an operation of the period K4 except for the voltage of the original driving signal Ca. That is, in the period K4, the voltage of the driving signal Com-A is kept approximately constant at a target voltage Vmax while oscillating.

Since the period K5 is a period during which the voltage of the original driving signal Ca decreases, an operation of the period K5 is the same as the operation of the period K1. That is, in the period K5, the voltage of the driving signal Com-A decreases to a target voltage while oscillating.

Since the period K6 is a period during which the original driving signal Ca is constant at the voltage VCen/10, there is no difference between the operation of the period K2, the operation of the period K4, and an operation of the period K6 except for the voltage of the original driving signal Ca. That is, in the period K6, the voltage of the driving signal Com-A is kept approximately constant at a target voltage VCen while oscillating.

In this way, in the periods K1 to K6, both the transistors 231 and 232 are alternately and repeatedly switched on, so that the voltage of the driving signal Com-A is controlled to arrives at the target voltages while oscillating.

Here, in the present embodiment, before an effect obtained by alternately and repeatedly switching on the transistors 231 and 232 is explained, a driving circuit according to the related art will be described.

Figure 21:
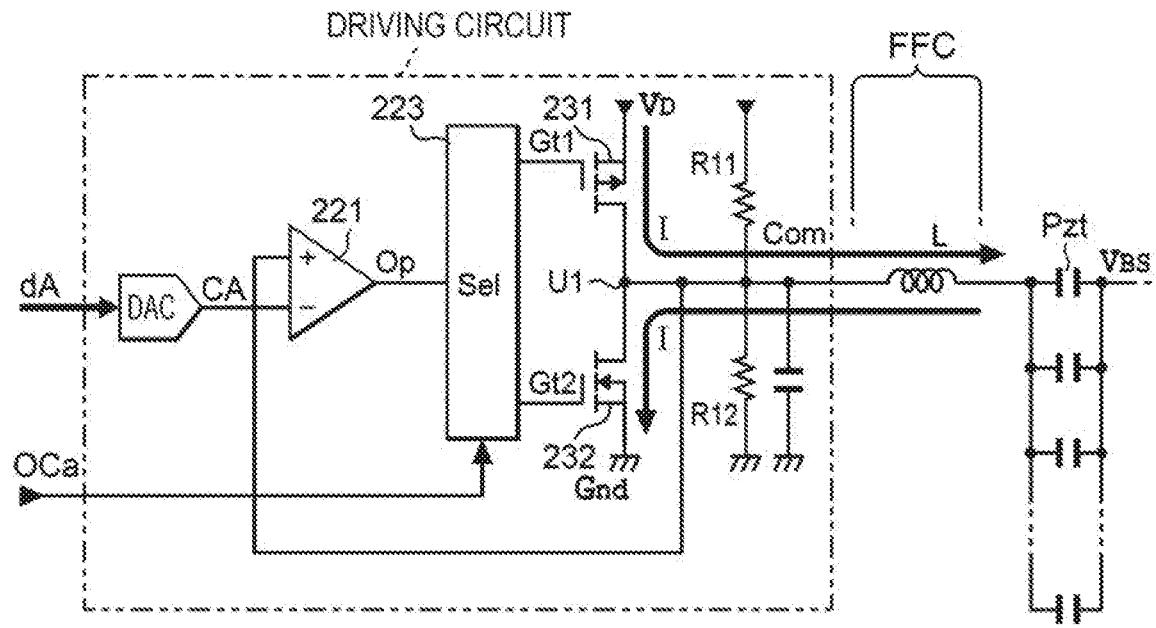
FIG. 21 is a diagram illustrating a configuration of a driving circuit according to the related art.
Figure 22:
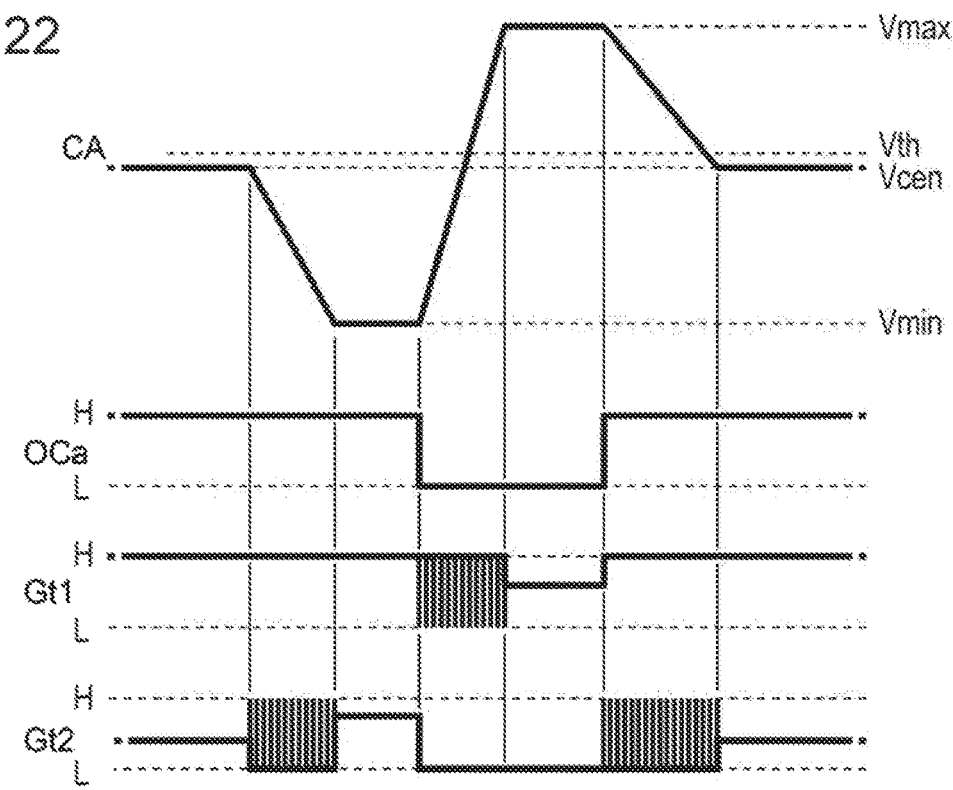
FIG. 22 is a diagram for illustrating an operation of the driving circuit according to the related art.

FIG. 21 is a diagram illustrating a configuration of a driving circuit according to the related art, which is described in JP-A-2017-149064, and FIG. 22 is a diagram for illustrating an operation of the driving circuit.

The driving circuit illustrated in FIG. 21 is different from the driving circuit 122a illustrated in FIG. 7 in that the comparator 1204 in FIG. 7 is replaced by a differential amplifier 221 and in that the control signal generating circuit 126 is replaced by a selector 223 and a signal OCa is supplied. For convenience, the gate signal to the transistor 231 is renamed Gt1, and the gate signal to the transistor 232 is renamed Gt2.

For comparison, one driving circuit is simply illustrated in FIG. 21. It may be considered that in the driving circuit illustrated in FIG. 21, although the resistive elements R1 and R2 are not included, the signal CA is amplified by ten times by the DAC, and is supplied to a negative input terminal (−) of a differential amplifier 221.

The differential amplifier 221 outputs a signal Op corresponding to a voltage difference between the signal CA and a feedback signal (a driving signal Com) from the node U1 supplied to a positive input terminal (+). That is, the differential amplifier 221 is not a comparator that outputs a result of comparison but an operational amplifier that outputs a signal corresponding to a voltage difference.

As illustrated in FIG. 22, the signal OCa becomes the level L during a period during which the voltage of the signal CA increases and during a period during which the voltage of the signal CA is kept constant at a voltage that is equal to or more than a voltage Vth, and becomes the level H during the other periods.

The voltage Vth is approximately equal to a divided voltage of the power supply voltage $V_D$ determined by resistive elements R11 and R12.

When the signal OCa is in the level L, the selector 223 selects an output signal of the differential amplifier 221 as the gate signal Gt1, supplies the gate signal Gt1 to the gate terminal of the transistor 231, selects the level L as the gate signal Gt2, and supplies the gate signal Gt2 to the gate terminal of the transistor 232. Meanwhile, when the signal OCa is in the level H, the selector 223 selects the level H as the gate signal Gt1, supplies the gate signal Gt1 to the gate terminal of the transistor 231, selects the output signal of the differential amplifier 221 as the gate signal Gt2, and supplies the gate signal Gt2 to the gate terminal of the transistor 232.

In a period during which the voltage of the signal CA increases, since the signal OCa becomes the level L, the selector 223 switches off the transistor 232 as a result of selecting the level L as the gate signal Gt2. Further, in the period during which the voltage of the signal CA increases, the selector 223 selects the signal Op as the gate signal Gt1.

In the period during which the voltage of the signal CA increases, since the voltage of the signal CA increases earlier than the voltage of the node U1, the voltage of the output signal of the differential amplifier 221 selected as the gate signal Gt1 decreases according to a voltage difference therebetween and swings to substantially to the level L. When the gate signal Gt1 becomes the level L, since the transistor 231 is switched off, the voltage of the node U1 increases. The voltage of the node U1 does not actually increase to the voltage $V_D$ at once but slowly increases to the voltage $V_D$, due to the piezoelectric element Pzt having a capacitive property or the like.

When the voltage of the node U1 becomes equal to or more than the voltage of the signal CA, the gate signal Gt2 becomes the level H, and the transistor 231 is switched off. When the transistor 231 is switched off, although the increase in the voltage of the node U1 is stopped, since the voltage of the signal CA is increasing, the voltage of the node U1 becomes lower than the voltage of the signal CA again. Therefore, the gate signal Gt1 becomes the level L, and the transistor 231 is switched on again.

Therefore, in the period during which the voltage of the signal CA increases, in a state in which the transistor 232 is switched off, the transistor 231 is repeatedly switched on and off, that is, performs a switching operation. A control of causing the voltage of the node U1, that is, the voltage of the driving signal Com to follow the increase in the voltage of the signal CA is executed by this switching operation.

The transistor 231 may perform a linear operation instead of the switching operation although depending on conditions.

In a period during which the voltage of the signal CA decreases, since the signal OCa becomes the level H, the selector 223 switches off the transistor 231 as a result of selecting the level H as the gate signal Gt1. Further, in the period during which the voltage of the signal CA decreases, the selector 223 selects the signal Op as the gate signal Gt1.

However, contrary to the period during which the voltage of the signal CA increases, in the period during which the voltage of the signal CA decreases, in a state in which the transistor 231 is switched off, the transistor 232 is repeatedly switched on and off, that is, performs a switching operation. A control of causing the voltage of the driving signal Com to follow the decrease in the voltage of the signal CA is executed by this switching operation.

The transistor 232 may perform a linear operation instead of the switching operation although depending on conditions.

In a period during which the signal CA is constant at a voltage that is less than a threshold Vth in FIG. 22, since the signal OCa becomes the level H, the selector 223 selects the level H as the gate signal Gt1, and selects the signal Op as the gate signal Gt2.

In this period, if the voltage of the node U1 is higher than the voltage of the signal CA, since the output voltage of the differential amplifier 221 becomes high, the voltage of the gate signal Gt2, that is, a resistance between the source terminal and the drain terminal of the transistor 232, becomes small, and the voltage of the node U1 decreases. Meanwhile, if the voltage of the node U1 is less than the voltage of the signal CA, since the voltage of the gate signal Gt2 also becomes low, resistance between the source terminal and the drain terminal of the transistor 232 increases, and the voltage of the node U1 increases to approach the voltage Vth. That is, the transistor 232 performs the linear operation.

Therefore, in this period, control is performed in which the direction of decreasing the voltage of the node U1 and the direction of increasing the voltage of the node U1 are balanced. In detail, the voltage of the node U1 is controlled to be constant at the voltage Vmin or the voltage VCen of the signal CA.

In a period during which the signal CA is constant at a voltage that is equal to or more than the threshold Vth in FIG. 22, since the signal OCa becomes the level L, the selector 223 selects the signal Op as the gate signal Gt1, and selects the level L as the gate signal Gt2.

In this period, if the voltage of the node U1 is more than the voltage of the signal CA, since the voltage of the gate signal Gt1 also becomes high, resistance between the source terminal and the drain terminal of the transistor 231 decreases, and the voltage of the node U1 decreases to approach the voltage Vth.

Meanwhile, if the voltage of the node U1 is less than the voltage of the signal CA, since the voltage of the gate signal Gt1 becomes low, resistance between the source terminal and the drain terminal of the transistor 231 increases, and the voltage of the node U1 increases. That is, the transistor 231 performs the linear operation.

However, even in this period, the voltage of the node U1 is controlled to be constant at the voltage Vmax of the signal CA.

However, in the driving circuit according to the related art, it is pointed out that when a load is large, waveform accuracy of the driving signal Com deteriorates, which adversely affects the ejection of the ink.

In particular, in recent years, demand for high-speed printing and high-definition printing is increasing, and it is necessary to greatly increase the number of the nozzles in order to meet the demand. As a result, the number of the piezoelectric elements driven at the same time also increases greatly. When the number of piezoelectric elements Pzt driven is large, a current I flowing between the driving circuit and the piezoelectric element group for the driving circuit greatly increases.

Further, in the LFP that can perform printing on the medium P having a large size, the FFC 190 becomes long. Therefore, parasitic inductances L of the FFC 190 and a substrate wiring increase.

In a situation in which the current I increases and the parasitic inductance L of the substrate wiring is large, noise having a magnitude that is proportional to a product (LxdI/dt) of the parasitic inductance L and a rate of a change in the current I overlaps in the driving signal Com that drives the piezoelectric element, so that a large ripple occurs.

In detail, in the driving circuit according to the related art, immediately after the transistor 231 changes from an ON state to an OFF state in a period during which the voltage of the original driving signal CA increases, the current I does not immediately become zero due to influence of the parasitic inductance L. Further, immediately after the transistor 231 changes from the OFF state to the ON state, the current I does not instantaneously start flowing due to the influence of the parasitic inductance L.

Therefore, in the period during which the voltage of the original driving signal CA increases, in contrast to the ON/OFF state of the transistor 231, the ON/OFF state is not immediately reflected on a current of the driving signal. Even in a period during which the voltage of the original driving signal CA decreases, similarly, in contrast to the ON/OFF state of the transistor 232, the ON/OFF state is not immediately reflected on a voltage of the driving signal.

In this way, in the driving circuit according to the related art, the current of the driving signal Com does not flow according to the ON/OFF state of the transistor 231 or 232, and the current becomes delayed. As a result, a large ripple occurs in the driving signal Com.

Further, in the driving circuit according to the related art, in a period during which the voltage of the original driving signal CA is kept constant, the transistor 231 or 232 performs not the ON/OFF switching operation but the linear operation. Therefore, immediately after the original driving signal CA shifts from the voltage changing period to the voltage-constant period, an error occurs easily.

Figure 23:
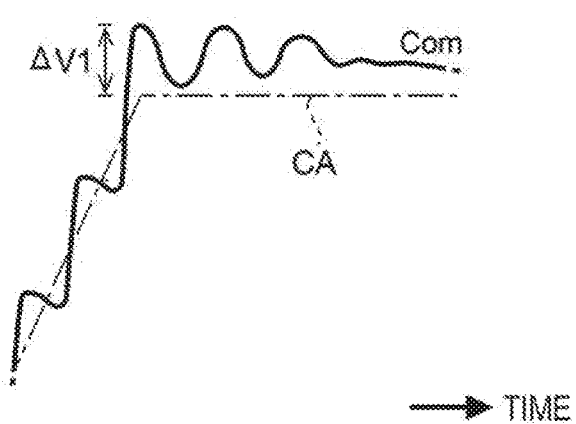
FIG. 23 is a partial enlarged view illustrating a waveform of a driving signal generated by the driving circuit according to the related art.
Figure 24:
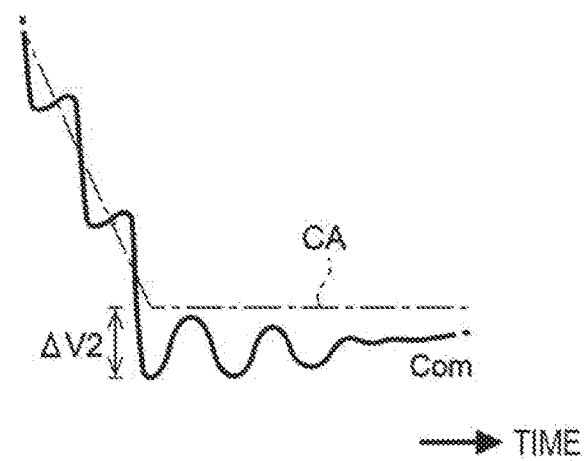
FIG. 24 is a partial enlarged view illustrating a waveform of the driving signal generated by the driving circuit according to the related art.

In detail, when the original driving signal CA shifts from the voltage increasing period to the voltage-constant period, as illustrated in FIG. 23, the voltage of the driving signal Com has an error $\Delta V1$, and when the original driving signal CA shifts from the voltage decreasing period to the voltage-constant period, as illustrated in FIG. 24, the voltage of the driving signal Com has an error $\Delta V2$.

Therefore, in the driving circuit according to the related art, when the number of the piezoelectric elements driven at the same time is large or when the FFC 190 becomes long, the waveform accuracy of the driving signal Com deteriorates, which adversely affects the ejection of the ink.

In contrast, in the present embodiment, in the voltage changing period and the voltage-constant period of the original driving signal Ca, since the transistors 231 and 232 are alternately and repeatedly switched on, the following effects are obtained.

In detail, even in the driving circuit 122*a* according to the present embodiment, if the parasitic inductance L is large, immediately after the transistor 231 (232) changes from the ON state to the OFF state, the current I does not become zero immediately. However, after the transistor 231 (232) is switched off, the transistor 232 (231) is switched on, and the current I tries to flow in an opposite direction. Thus, the current I can be quickly lowered.

Therefore, in the present embodiment, since the voltage of the driving signal Com-A precisely follows a voltage obtained by amplifying the voltage of the original driving signal Ca by ten times, even when the number of the piezoelectric elements driven at the same time is large or the FFC 190 becomes long, the waveform accuracy of the driving signal Com-A can be kept high. Thus, in the present embodiment, it is possible to eject the ink at high precision.

Further, in the present embodiment, in the periods K1, K3, and K5 during which the voltage of the original driving signal Ca changes, the signal Fctl-A becomes the level L, and in the periods K2, K4, and K6 during which the voltage of the original driving signal Ca does not change, the signal Fctl-A becomes the level H.

Then, what happens when the level of the signal Fctl-A is switched will be described.

As described above, when the signal Fctl-A is in the level L, the capacitor Cp is disconnected from the gate terminal of transistor 231, and the capacitor Cn is disconnected from the gate terminal of transistor 232.

Meanwhile, when the signal Fctl-A is in the level H, the capacitor Cp is electrically interposed between the gate terminal and the drain terminal of the transistor 231. When the capacitor Cp is interposed between the gate terminal and the drain terminal of the transistor 231, since the amount of negative feedback is larger as a frequency is larger, a gain of the transistor 231 is reduced by this amount, and driving ability is lowered. Similarly, when the signal Fctl-A is in the level L, since the capacitor Cn is electrically interposed between the gate terminal and the drain terminal of the transistor 232, driving ability of the transistor 232 is lowered.

A transistor having high driving ability to sufficiently follow a maximum inclination of the original driving signal Ca (or Cb) is selected as the transistors 231 and 232. However, when the voltage of the original driving signal Ca or Cb does not change, it is unnecessary to mostly drive the piezoelectric element Pzt which corresponds to a capacitive load.

In the present embodiment, in the voltage changing period and the voltage-constant period of the original driving signal Ca, since the transistors 231 and 232 are alternately and repeatedly switched on, the driving signal Com-A arrives at the target voltage while oscillating.

Therefore, when the original driving signal Ca is shifted to the voltage-constant period while the driving ability of the transistors 231 and 232 is kept high so as to follow the maximum inclination of the original driving signal Ca, the oscillation width of the driving signal Com-A in this period becomes the same as the oscillation width in the voltage change period, which causes an error.

In this regard, in the present embodiment, the driving ability of the transistors 231 and 232 in the voltage-constant period of the original driving signal Ca becomes lower than the driving ability of the transistors 231 and 232 in the voltage changing period of the original driving signal Ca.

Therefore, in the present embodiment, since the oscillation width of the driving signal Com-A in the voltage-constant period of the original driving signal Ca is smaller than the oscillation width of the driving signal Com-A in the voltage changing period of the original driving signal Ca, an error with respect to the target voltage (10 times larger than the voltage of the original driving signal Ca) can be reduced.

Here, for convenience of description, as illustrated in FIG. 11, in the period K3 during which the voltage of the original driving signal Ca increases, a waveform portion of the driving signal Com-A is set as a first region. Since the voltage of the driving signal Com-A arrives at the target voltage while oscillating, the first region may be set as a region in which an oscillation center value of the voltage of the driving signal Com-A increases.

Further, in the period K1 during which the voltage of the original driving signal Ca decreases, a waveform portion of the driving signal Com-A is set as a second region. The second region may be set as a region in which the oscillation center value of the voltage of the driving signal Com-A decreases.

A region between the first region and the second region among the waveform portion of the driving signal Com-A is set as a third region, and the waveform portion of the driving signal Com-A when the voltage of the original driving signal Ca is constant after the second region is set as a fourth region.

The waveform portion of the driving signal Com-A is in an order of the second region, the third region, the first region, and the fourth region in time series.

Figure 12:
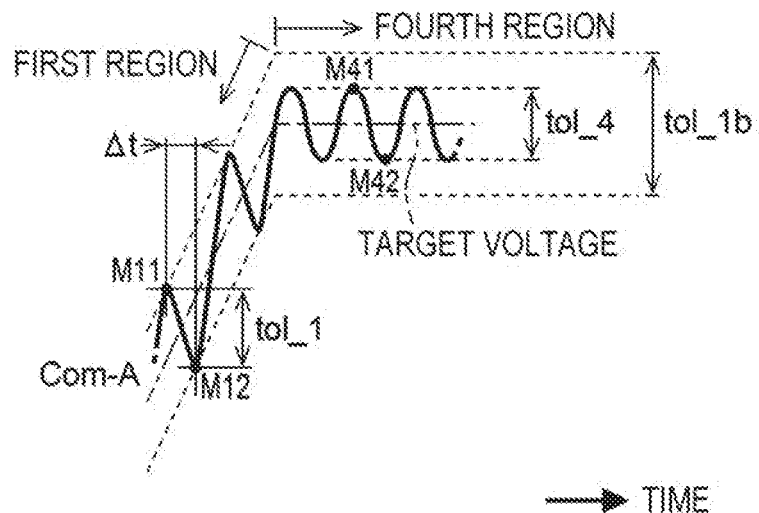
FIG. 12 is a partial enlarged view illustrating the waveform of the driving signal.
Figure 13:
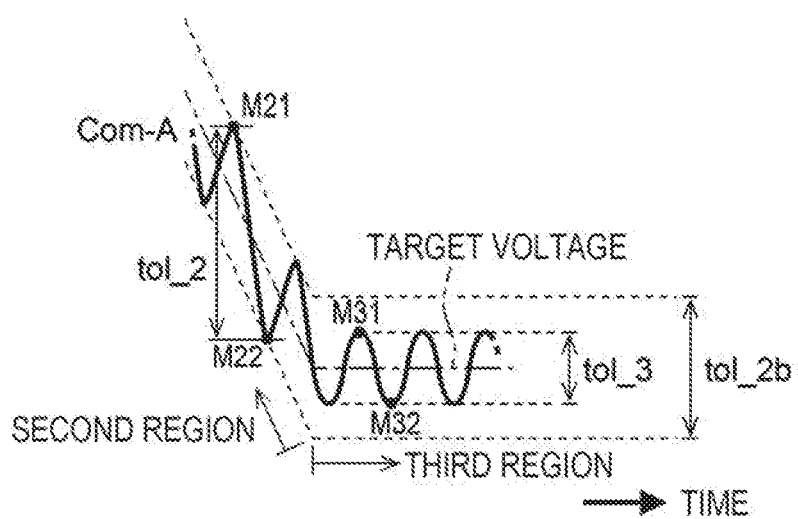
FIG. 13 is a partial enlarged view illustrating the waveform of the driving signal.

FIGS. 12 and 13 are partial enlarged views illustrating the waveform of the driving signal Com-A in FIG. 11. In detail, FIG. 12 is an enlarged view illustrating a portion of the waveform portion of the driving signal Com-A, which changes from the first region to the fourth region, and FIG. 13 is an enlarged view illustrating a portion of the waveform portion of the driving signal Com-A, which changes from the second region to the fourth region.

As illustrated in FIG. 12, an oscillation width tol_1 in the first region is larger than an oscillation width tol_4 in the fourth region. Here, the oscillation width tol_1 is a voltage difference between a voltage maximum value M11 of the driving signal Com-A when the transistor 231 is switched on in the first region and a voltage minimum value M12 of the driving signal Com-A when the transistor 232 is switched on after the first region. Strictly speaking, it is necessary that the oscillation width tol_1 is considered as an increase amount of the target voltage in a time difference Δt between the voltage maximum value M11 and the voltage minimum value M12. In detail, it is necessary that the oscillation width in the first region is considered as a voltage difference tol_1b between a straight line connecting the voltage maximum values and a straight line connecting the voltages minimum values. However, actually, since the increase amount of the target voltage at the time difference Δt is sufficiently smaller than the voltage difference between the voltage maximum value M11 and the voltage minimum value M12 and thus is negligible, in the present example, the oscillation width tol_1 can be regarded as the voltage difference tol_1b.

A straight line (a one-dot chain line, a target voltage) that is spaced apart by the same distance from a straight line connecting the voltage maximum values of the driving signal Com-A when the transistor 231 is switched on and a straight line connecting the voltage minimum values of the driving signal Com-A when the transistor 232 is switched on indicates a temporal change in the oscillation center value.

Further, the oscillation width tol_4 is a voltage difference between a voltage maximum value M41 of the driving signal Com-A when the transistor 231 is switched on in the fourth region and a voltage minimum value M42 of the driving signal Com-A when the transistor 232 is switched on after the fourth region.

As illustrated in FIG. 13, an oscillation width tol_2 in the second region is larger than an oscillation width tol_3 in the third region.

Here, the oscillation width tol_2 is a voltage difference between a voltage maximum value M21 of the driving signal Com-A when the transistor 231 is switched on in the second region and a voltage minimum value M22 of the driving signal Com-A when the transistor 232 is switched on after the second region. Similarly to the oscillation width tol_1, since the decrease amount of the target voltage at the time difference from the voltage maximum value M21 to the voltage minimum value M22 is negligible, the oscillation width tol_2 can be regarded as the voltage difference tol_2b.

Further, the oscillation width tol_3 is a voltage difference between a voltage maximum value M31 of the driving signal Com-A when the transistor 231 is switched on in the third region and a voltage minimum value M32 of the driving signal Com-A when the transistor 232 is switched on after the third region.

In the present embodiment, the oscillation width tol_1 and the oscillation width tol_2 when the target voltage changes are substantially the same. This is because when the target voltage changes even in the period during which the voltage of the original driving signal increases or decreases, the driving abilities of the transistors 231 and 232 are kept relatively high.

Further, in the present embodiment, the oscillation width tol_3 and the oscillation width tol_4 when the target voltage is constant are substantially the same. This is because when the target voltage is constant even when the voltage of the original driving signal is high or low, the driving abilities of the transistors 231 and 232 become similarly low as compared to a case where the target voltage changes.

In the driving signal Com-A, wave accuracy when the oscillation center value of the voltage changes from a region where the oscillation center value decreases or increases to a region where the oscillation center value is constant easily affects the ejection of the ink. In detail, since the ink is ejected at a timing when the driving signal Com-A changes from the first region to the fourth region, when the angle of the trapezoidal waveform at this timing is not as designed, ejection accuracy of the ink deteriorates.

As the transistors 231 and 232 are alternately switched on, when the driving signal Com-A oscillates with respect to the target voltage, if the voltage of the driving signal Com-A changes from a region where the voltage changes to a region where the voltage is constant, when the oscillation width is large, since an error accordingly becomes larger, waveform accuracy is easy to deteriorate.

According to the present embodiment, since the oscillation width tol_1 (or the oscillation width tol_2) is smaller than the oscillation width tol_3 (or the oscillation width tol_4), accuracy of the trapezoidal waveform of the driving signal Com-A can be higher as compared to a configuration in which the oscillation width does not change. Therefore, in the present embodiment, a reduction in ink ejection accuracy can be suppressed.

Here, although the driving circuit 122a that generates the driving signal Com-A has been described, the driving circuit 122b that generates the driving signal Com-B has the same operation except that the input signal and the output signal are different.

In the present embodiment, various configurations other than the configuration illustrated in FIG. 7 can be applied to the adjustment circuit 128 or the like. Next, another example of the adjustment circuit 128 will be described.

Figure 14:
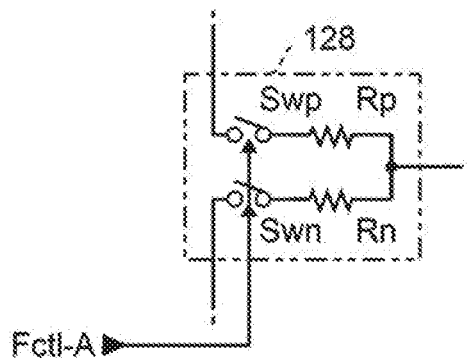
FIG. 14 is a diagram illustrating a configuration example of an adjustment circuit.

FIG. 14 is a diagram illustrating an example of another configuration of the adjustment circuit 128.

The adjustment circuit 128 illustrated in FIG. 14 is different from the configuration illustrated in FIG. 7 in that the capacitor Cp is connected to a resistive element Rp (a first resistive element), and the capacitor Cn is connected to a resistive element Rn (a second resistive element).

Therefore, in the adjustment circuit 128 illustrated in FIG. 14, the resistive element Rp is an element that is provided between the gate terminal and the drain terminal of the transistor 231 to be switched between electrical connection or electrical disconnection according to the signal Fctl-A, and the resistive element Rn is an element that is provided between the gate terminal and the drain terminal of the transistor 232 to be switched between electrical connection or electrical disconnection according to the signal Fctl-A.

In the adjustment circuit 128 illustrated in FIG. 14, if the signal Fctl-A is in the level H, when the resistive element Rp is interposed between the gate terminal and the drain terminal of the transistor 231, since the amount of negative feedback becomes large, a gain of the transistor 231 is reduced by this amount, and the driving ability is lowered. Similarly, when the signal Fctl-A is in the level L, since the resistive element Rn is electrically interposed between the gate terminal and the drain terminal of the transistor 232, driving ability of the transistor 232 is lowered.

A transistor having high driving ability to sufficiently follow a maximum inclination of the original driving signal Ca (or Cb) is selected as the transistors 231 and 232. However, when the voltage of the original driving signal Ca or Cb does not change, it is unnecessary to mostly drive the piezoelectric element Pzt which corresponds to a capacitive load.

In the present embodiment, in the voltage changing period and the voltage-constant period of the original driving signal Ca, since the transistors 231 and 232 are alternately and repeatedly switched on, the driving signal Com-A arrives at the target voltage while oscillating.

Therefore, when the original driving signal Ca is shifted to the voltage-constant period while the driving ability of the transistors 231 and 232 is kept high so as to follow the maximum inclination of the original driving signal Ca, the oscillation width of the driving signal Com-A in this period becomes the same as the oscillation width in the voltage change period, which causes an error.

In contrast, according to the driving circuit 122a using the adjustment circuit 128 as illustrated in FIG. 14, similarly to the adjustment circuit of FIG. 7, the driving ability of the transistors 231 and 232 in the voltage-constant period of the original driving signal Ca is lower than the driving ability of the transistors 231 and 232 in the voltage changing period of the original driving signal Ca. Therefore, since the oscillation width of the driving signal Com-A in the voltage-constant period of the original driving signal Ca is smaller than the oscillation width of the driving signal Com-A in the voltage changing period of the original driving signal Ca, an error with respect to the target voltage can be reduced.

Figure 15:
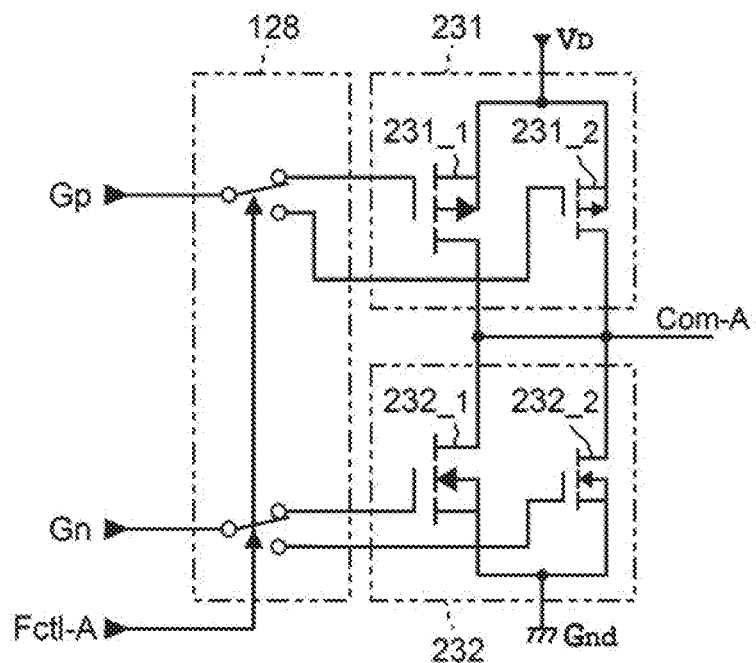
FIG. 15 is a diagram illustrating a configuration example of the adjustment circuit.

FIG. 15 is a diagram showing another configuration of the adjustment circuit 128.

In short, the adjustment circuit 128 illustrated in FIG. 15 switches to one of transistors 231_1 and 232_1 having relatively high driving ability and transistors 231_2 and 232_2 having relatively low driving ability according to the level of the signal Fctl-A. In FIG. 15, a difference in the driving ability is represented by the size.

When the signal Fctl-A is in the level L, the adjustment circuit 128 illustrated in FIG. 15, which is a double-pole double-throw switch, supplies the gate signal Gp to the gate terminal of the transistor 231_1, and supplies the gate signal Gn to the gate terminal of the transistor 232_1. Meanwhile, when the signal Fctl-B is in the level H, the adjustment circuit 128 supplies the gate signal Gp to the gate terminal of transistor 231_2, and supplies the gate signal Gn to the gate terminal of the transistor 232_2.

In FIG. 15, although the transistor 231 includes transistor 231_1 and 231_2, one of the transistors 231_1 and 231_2 is actually used. Similarly, although the transistor 232 includes the transistor 232_1 and 232_2, one of the transistors 232_1 and 232_2 is actually used.

Even in the configuration illustrated in FIG. 15, the driving ability of the transistors 231 and 232 in the voltage-constant period of the original driving signal Ca is lower than the driving ability of the transistors 231 and 232 in the voltage changing period of the original driving signal Ca. Therefore, since the oscillation width of the driving signal Com-A in the voltage-constant period of the original driving signal Ca is smaller than the oscillation width of the driving signal Com-A in the voltage changing period of the original driving signal Ca, an error with respect to the target voltage can be reduced.

In FIG. 15, one of the transistors 231_1 and 232_1 having relatively high driving ability and the transistors 231_2 and 232_2 having relatively low driving ability is switched according to the level of the signal Fctl-A. However, in order to increase the driving ability, it is also possible to increase the number of transistors connected in parallel to each other.

In the above-described driving circuit 122a (122b), the pair of transistors 231 and 232 are operated at the power supply voltage ($V_D$-Gnd) to generate the driving signal Com-A (Com-B). Since the voltage $V_D$ is set to 42 V as described above, a high withstand voltage is required for the control signal generating circuit 126 and the like. This is because it is necessary to supply the gate signal Gp to the gate terminal of the transistor 231, and to supply the gate signal Gn to the gate terminal of the transistor 232.

Next, a driving circuit that has improved this point will be described.

Figure 16:
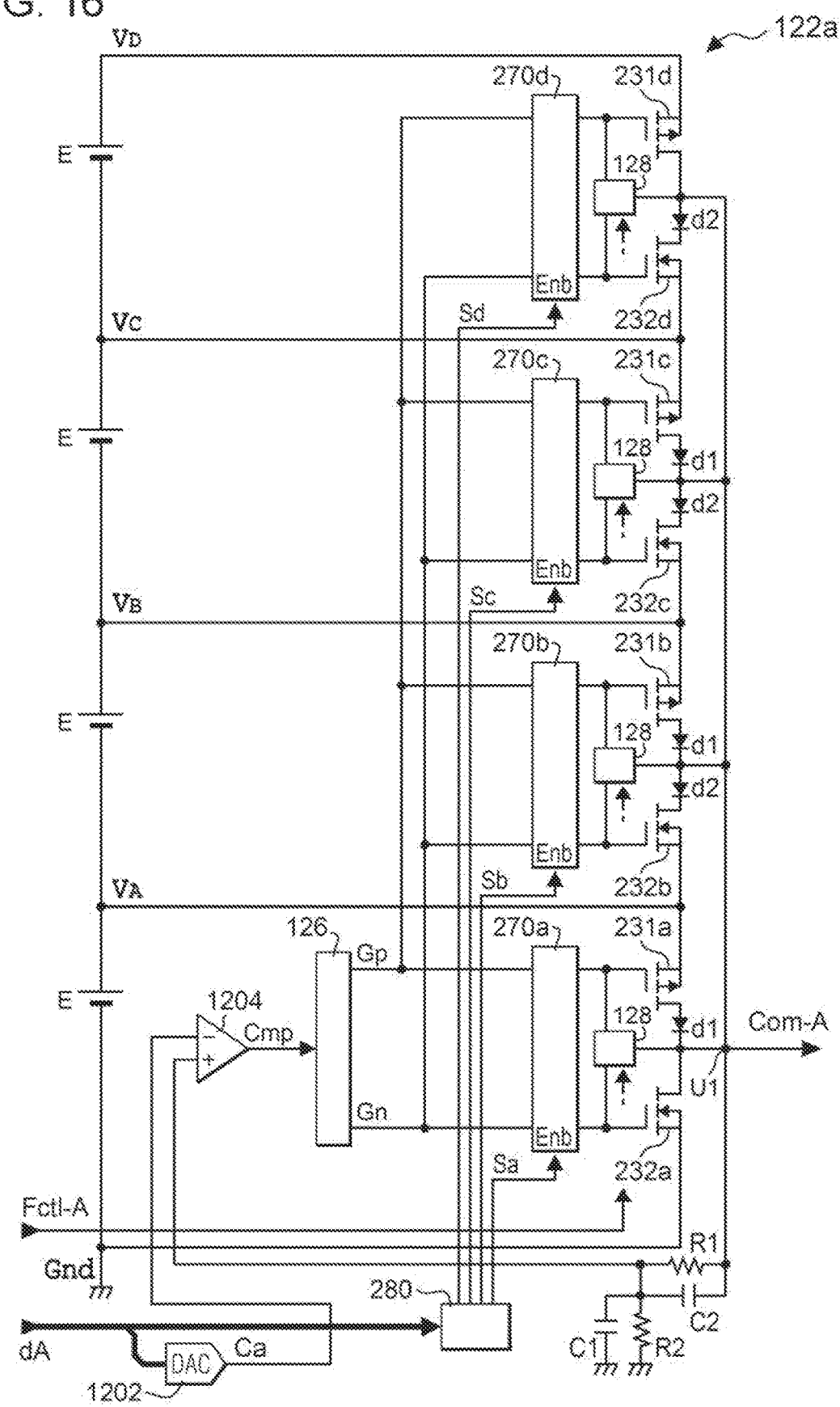
FIG. 16 is a diagram illustrating a configuration of a driving circuit according to a first application example.

FIG. 16 is a diagram illustrating a configuration of a driving circuit according to a first application example.

As illustrated in the drawing, the driving circuit 122a according to the first application example includes four reference power sources E, level shifters 270a, 270b, 270c, and 270d, a selector 280, four transistor pairs, four adjustment circuits 128, and capacitors C1 and C2 in addition to the DAC 1202 and the comparator 1204.

According to the first application example, the reference power sources, each of which outputs a voltage E, are connected to in series to each other in four stages, to output voltages $V_A$, $V_B$, $V_C$, and $V_D$ as the voltages E, 2E, 3E, and 4E, respectively. When the reference power source E outputs, for example, 10.5 V, the voltages $V_A$, $V_B$, $V_C$, and $V_D$ are 10.5 V, 21.0 V, 31.5 V, and 42.0 V, respectively.

According to the first application example, a voltage range is defined by the voltages $V_A$, $V_B$, $V_C$, and $V_D$.

Figure 17:
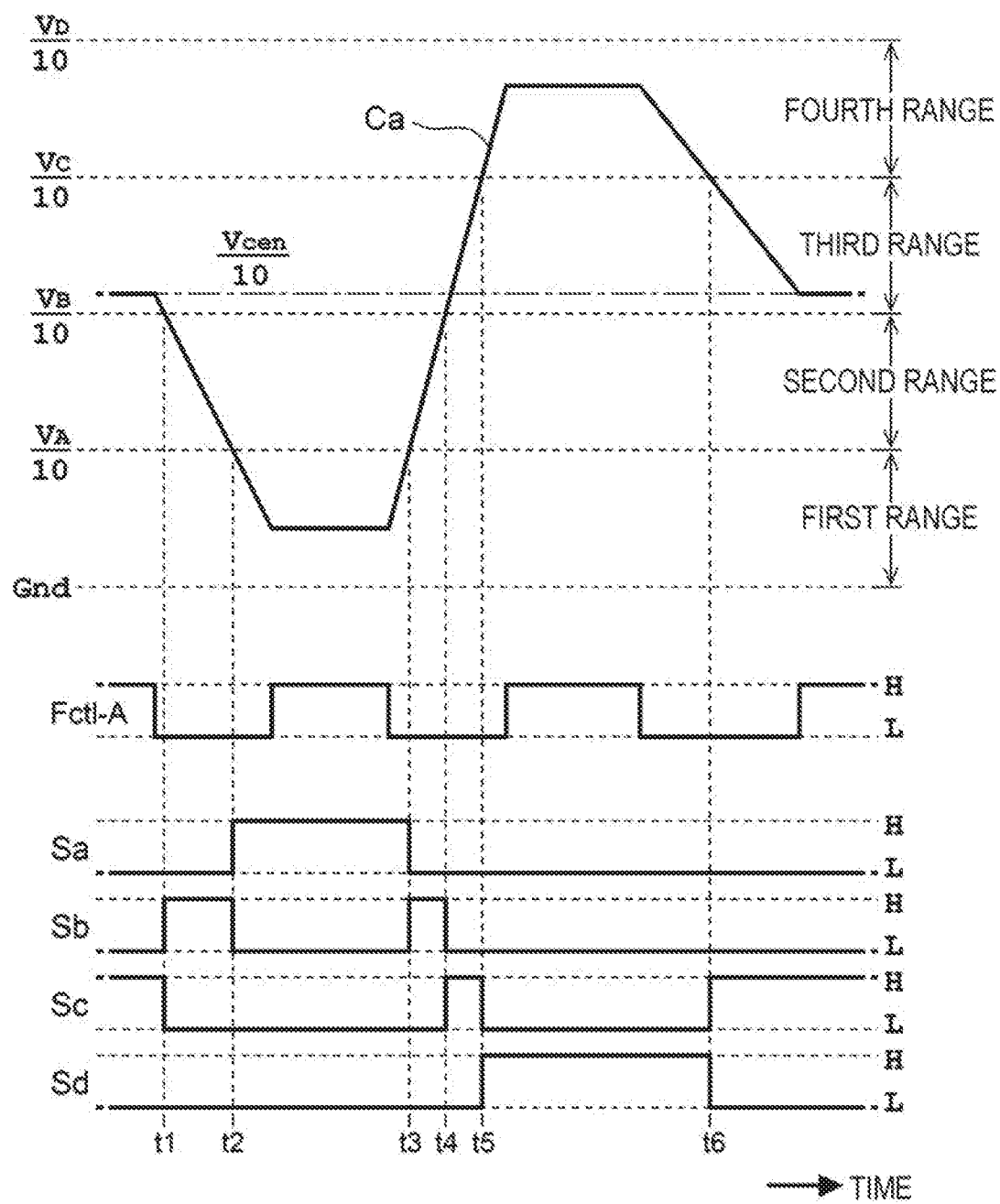
FIG. 17 is a diagram for illustrating an operation of the driving circuit according to the first application example.

That is, as illustrated in FIG. 17, a range that is equal to or more than the ground Gnd having a voltage of zero and is less than a voltage $V_A/10$ is defined as a first range, a range that is equal to or more than the voltage $V_A/10$ or is less a voltage $V_B/10$ is defined as a second range, a range that is equal to or more than the voltage $V_B/10$ and is less than a voltage $V_C/10$ is defined as a third range, and a range that is equal to or more than the voltage $V_C/10$ and is less than $V_D/10$ is defined as a fourth range.

In FIG. 16, the signal Ca is supplied to the negative input terminal (−) of the comparator 1204, and a signal obtained by stepping down the voltage of the driving signal Com-A outputted from the note U1 by one tenth by the resistive elements R1 and R2 is fed back to the positive input terminal (+) of the comparator 1204 as a feedback signal.

The control signal generating circuit 126 generates the gate signals Gp and Gn based on the signal Cmp from the comparator 1204.

According to the first application example, unlike the embodiment (see FIG. 7), a high side of the power supply voltage of the comparator 1204 is set as the voltage $V_A$. Therefore, the levels H of the gate signals Gp and Gn are the voltage $V_A$.

The selector 280 determines the voltage range of the original driving signal Ca from the data dA supplied from the controller 110 and outputs selection signals Sa, Sb, Sc, Sd according to a result of the determination as described below.

In detail, when the voltage of the original driving signal Ca defined by the data dA is included in the first range, that is, when the voltage of the driving signal Com-A obtained by amplifying the voltage of the original driving signal Ca by 10 times is equal to or more than the ground Gnd and is less than the voltage $V_A$, the selector 280 sets only the selection signal Sa to the level H and sets the other selection signals Sb, Sc, and Sd to the level L.

Further, when the voltage of the original driving signal Ca is included in the second range, that is, when the voltage of the driving signal Com-A is equal to or more than the voltage $V_A$ and is less than the voltage $V_B$, the selector 280 sets only the selection signal Sb to the level H and sets the other selection signals Sa, Sc, and Sd to the level L. Similarly, when the voltage of the original driving signal Ca is included in the third range, that is, when the voltage of the driving signal Com-A is equal to or more than the voltage $V_B$ and is less than the voltage $V_C$, the selector 280 sets only the selection signal Sc to the level H and sets the other selection signals Sa, Sb, and Sd to the level L. Further, when the voltage of the original driving signal Ca is included in the fourth range, that is, when the voltage of the driving signal Com-A is equal to or more than the voltage $V_C$ and is less than the voltage $V_D$, the selector 280 sets only the selection signal Sd to the level H and sets the other selection signals Sa, Sb, and Sc to the level L.

For convenience of description, four transistor pairs will be described.

In this example, the four transistor pairs include a pair of transistors 231a and 232a, a pair of transistors 231b and 232b, a pair of transistors 231c and 232c, and a pair of transistors 231d and 232d.

Among the respective transistor pairs, the high side transistors 231a, 231b, 231c, and 231d are, for example, P channel type field effect transistors, and the low side transistors 232a, 232b, 232c, and 232d are, for example, N channel type field effect transistors.

The voltage $V_A$ is applied to a source terminal of the high side transistor 231a, and a drain terminal of the high side transistor 231a is connected to the node U1. A source terminal of the low side transistor 232a is connected to the ground Gnd, and a drain terminal of the low side transistor 232a is connected to the node U1. Similarly, the voltage $V_B$ ($V_C$ and $V_D$) is applied to a source terminal of the high side transistor 231b (231c and 231d), and a drain terminal of the high side transistor 231b (231c and 231d) is connected to the node U1. The voltage $V_A$ ($V_B$ and $V_C$) is applied to a source terminal of low side transistor 232b (232c and 232d), and a drain terminal of the low side transistor 232b (232c and 232d) is connected to the node U1.

Further, the adjustment circuits 128 are provided to correspond to the four transistor pairs, respectively. The configuration of FIG. 7, the configuration of FIG. 14, and the configuration of FIG. 15 including the transistor pairs may be used as the adjustment circuit 128.

For example, when the transistor 231a is set as a first transistor, the transistor 232a is set as a second transistor, and the transistor 231a and 232a are set as a first transistor pair, the transistor 231b is set as a third transistor, the transistor 232b is set as a fourth transistor, and the transistors 231b and 232b are set as a second transistor pair.

Although details will be described below, when the level shifter 270a is enabled, the transistors 231a and 232a output the driving signal Com-A with a power supply voltage as the voltage $V_A$ and the ground Gnd, and when the level shifter 270b is enabled, the transistors 231b and 232b output the driving signal Com-A with a power supply voltage as the voltage $V_B$ and the voltage $V_A$. Similarly, when the level shifter 270c is enabled, the transistors 231c and 232c output the driving signal Com-A with a power supply voltage as the voltage $V_C$ and the voltage $V_B$, and when the level shifter 270d is enabled, the transistors 231d and 232d output the driving signal Com-A with a power supply voltage as the voltage $V_D$ and the voltage $V_C$.

In this configuration, the power supply voltages of the transistors 231a and 232a, the power supply voltages of the transistors 231b and 232b, the power supply voltages of the transistors 231c and 232c, and the power supply voltages of the transistors 231d and 232d are set as 10.5 V.

When the selection signal Sa supplied to an input terminal Enb becomes the level H and the level shifter 270a is enabled, the level shifter 270a level-shifts the level H of the gate signals Gp and Gn outputted from the control signal generating circuit 126 to the voltage $V_A$ and the level L thereof to the ground Gnd, and supplies the level-shifted signals to gate terminals of the transistors 231a and 232a. In terms of the level shifter 270a, since the level H and the level L of the signals Gp and Gn coincide with the voltage $V_A$ and the ground Gnd, respectively, when the level shifter 270a is enabled, the signals Gp and Gn are supplied to the gate terminals of the transistors 231a and 232a as they are.

When the selection signal Sb becomes the level H and the level shifter 270b is enabled, the level shifter 270b level-shifts the level H of the gate signals Gp and Gn to the voltage $V_B$ and the level L thereof to the voltage $V_C$, and supplies the level-shifted signals to gate terminals of the transistors 231b and 232b. That is, in terms of the level shifter 270b, when the level shifter 270b is enabled, 10.5 V is added to the signals Gp and Gn, respectively, and the signals Gp and Gn are supplied to the gate terminals of the transistors 231b and 232b.

Similarly, when the selection signal Sc becomes the level H and the level shifter 270c is enabled, the level shifter 270c level-shifts the level H of the gate signals Gp and Gn the voltage $V_C$ and the level L thereof to the voltage $V_B$, and supplies the level-shifted signals to gate terminals of the transistors 231c and 232c. That is, in terms of the level shifter 270c, when the level shifter 270c is enabled, 21.0 V is added to the signals Gp and Gn, respectively, and the signals Gp and Gn are supplied to the gate terminals of the transistors 231c and 232c.

When the selection signal Sd becomes the level H and the level shifter 270d is enabled, the level shifter 270d level-shifts the level H of the gate signals Gp and Gn to the voltage $V_D$ and the level L thereof to the voltage $V_C$, and supplies the level-shifted signals to gate terminals of the transistors 231d and 232d. That is, in terms of the level shifter 270d, when the level shifter 270d is enabled, 31.5 V is added to the signals Gp and Gn, respectively, and the signals Gp and Gn are supplied to the gate terminals of the transistors 231d and 232d.

When the selection signal supplied to each input terminal Enb becomes the level L and is disabled, each of the level shifters 270a, 270b, 270c, and 270d outputs a signal for switching off the two transistors corresponding thereto. That is, when being disabled, the level shifters 270a, 270b, 270c, and 270d forcibly convert the signal Gp to the level H, and forcibly convert the signal Gn to the level L.

Here, the levels H and L correspond to a high side voltage and a low side voltage of the power supply voltage of each of the level shifters 270a, 270b, 270c, and 270d. For example, since the level shifter 270b has the voltage $V_B$ and the voltage $V_A$ as the power supply voltage, a high side voltage $V_B$ is in the level H, and a low side voltage $V_A$ is in the level L.

A capacitor C2 connected in parallel to the resistive element R1 and a capacitor C1 connected in parallel to the resistive element R2 are provided to compensate the phase when the driving signal Com-A is fed back.

Further, diodes d1 and d2 are provided to prevent backward flow. A forward direction of the diode d1 is a direction from the drain terminals of the transistors 231a, 231b, and 231c to the node U1, and a forward direction of the diode d2 is a direction from the node U1 to the drain terminals of the transistors 231b, 231c, and 231d. Here, since the voltage of the node U1 is higher than the voltage $V_D$, there is no need to consider the backward flow. Therefore, the diode d1 is provided in the transistor 231d. Similarly, since the voltage of the node U1 is lower than the ground Gnd corresponding to voltage zero, the diode d2 is not provided in the transistor 232a.

Next, an operation of the driving circuit according to the first application example will be described under a state in which the voltage waveform of the original driving signal Ca belongs to a range illustrated in FIG. 17.

First, when it is determined in the data dA that the voltage of the original driving signal belongs to the third range before a timing t1, the selector 280 sets only the selection signal Sc to the level H, and sets the other selection signals Sa, Sb, and Sd to the level L. Therefore, since the level shifter 270c is enabled and the other level shifters 270a, 270b, and 270d are disabled, the transistors 231c and 232c using the voltages $V_C$ and $V_B$ as a power source are alternately switched on, so that the voltage of the driving signal Com-A is controlled.

Next, when the voltage of the driving signal Ca belongs to the second range during a period from the timing t1 to a timing t2, the selector 280 sets only the selection signal Sb to the level H, and sets the other selection signals Sa, Sc, and Sd to the level L. Therefore, since the level shifter 270b is enabled and the other level shifters 270a, 270c, and 270d are disabled, the transistors 231b and 232b using the voltages $V_B$ and $V_A$ as a power source are alternately switched on, so that the voltage of the driving signal Com-A is controlled.

When the voltage of the original driving signal Ca belongs to the first range during a period from the timing t2 to a timing t3, the selector 280 sets only the selection signal Sa to the level H. As a result, since only the level shifter 270a is enabled, the transistors 231a and 232a using the voltage $V_A$ and the ground Gnd as a power source are alternately switched on, so that the voltage of the driving signal Com-A is controlled.

In the following brief description, during a period from the timing t3 to a timing t4, since only the level shifter 270b is enabled, the transistors 231b and 232b are alternately switched on, so that the voltage of the driving signal Com-A is controlled. During a period from the timing t4 to a timing t5, since only the level shifter 270c is enabled, the transistors 231c and 232c are alternately switched on, so that the voltage of the driving signal Com-A is controlled. During a period from the timing t5 to a timing t6, since only the level shifter 270d is enabled, the transistors 231d and 232d using the voltage $V_D$ and the voltage $V_C$ as a power source are alternately switched on, so that the voltage of the driving signal Com-A is controlled. Thus, from the timing t6, since only the level shifter 270c is enabled, the transistors 231c and 232c are alternately switched on, so that the voltage of the driving signal Com-A is controlled.

Even in the first application example, the driving abilities of the transistor pairs are switched according to the level of the signal Fctl-A. Therefore, the oscillation width of the voltage of the driving signal Com-A becomes small when the voltage of the original driving signal Ca is constant, and becomes large when the voltage of the original driving signal Ca changes.

Therefore, in the first application example, even when the number of the piezoelectric elements driven at the same time is large or the FFC 190 becomes long, the transistor pairs are alternately switched on and the dead zone is switched, so that the ink can be ejected in a state in which the waveform accuracy of the driving signal Com-A increases.

Further, in the first application example, although there are the four transistor pairs, since only one transistor pair is alternately switched on and the other transistor pairs are switched off, low power consumption can be achieved. Further, according to the first application example, since the comparator 1204 and the control signal generating circuit 126 are operated at a relatively low voltage ($V_A$-Gnd) as a power source, a withstand voltage is lowered as compared to the embodiment, and enlargement of the sizes of constituent elements, and the like can be suppressed.

According to the first application example, although the driving circuit 122a that generates the driving signal Com-A has been described as an example, the driving circuit 122b that generates the driving signal Com-B has the same configuration and the same operation. The following signal Fctl-B is supplied from the controller 110 to the driving circuit 122b according to the first application example. That is, the signal Fctl-B becomes the level L during a period during which the voltage of the signal Cb changes, and becomes the level H during a period during which the voltage of the signal Cb is constant.

Figure 20:
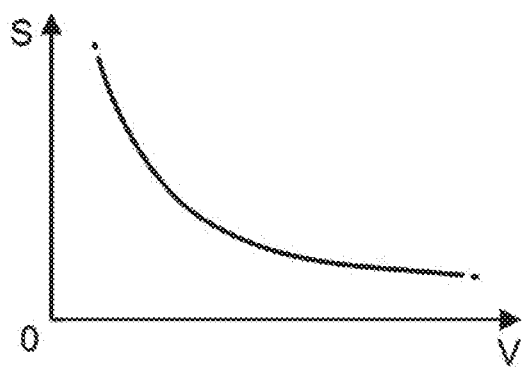
FIG. 20 is a diagram illustrating an example of characteristics between an applied voltage and a displacement in a piezoelectric element.

FIG. 20 is a diagram illustrating an example of characteristics of a displacement S with respect to a voltage V in the piezoelectric element Pzt. The voltage V is a difference between voltages applied to the driving electrodes 72 and 76 (see FIG. 4) in the piezoelectric element Pzt, that is, Vout-VBS, and the displacement S is a displacement amount (a Z direction) of the piezoelectric element Pzt when a constant voltage change is applied if the voltage V is applied.

In characteristics illustrated in FIG. 20, the displacement S of the piezoelectric element Pzt can increase as the applied voltage becomes lower. In other words, in the piezoelectric element Pzt, when the applied voltage is low, a large displacement is obtained using a minute voltage change. Therefore, when the piezoelectric element Pzt is driven by the driving signal Com-A (Com-B), as the voltage of the driving signal Com-A (Com-B) becomes lower, the higher waveform accuracy is required. In detail, in terms of the driving signal Com-A, the waveform accuracy is higher in the third region than in the fourth region.

Therefore, a driving circuit according to a second application example, which improves the waveform accuracy when the voltage of the driving signal Com-A is low, will be described.

The driving circuit according to the second application example has the same configuration as the driving circuit (see FIG. 16) according to the first application example.

Figure 18:
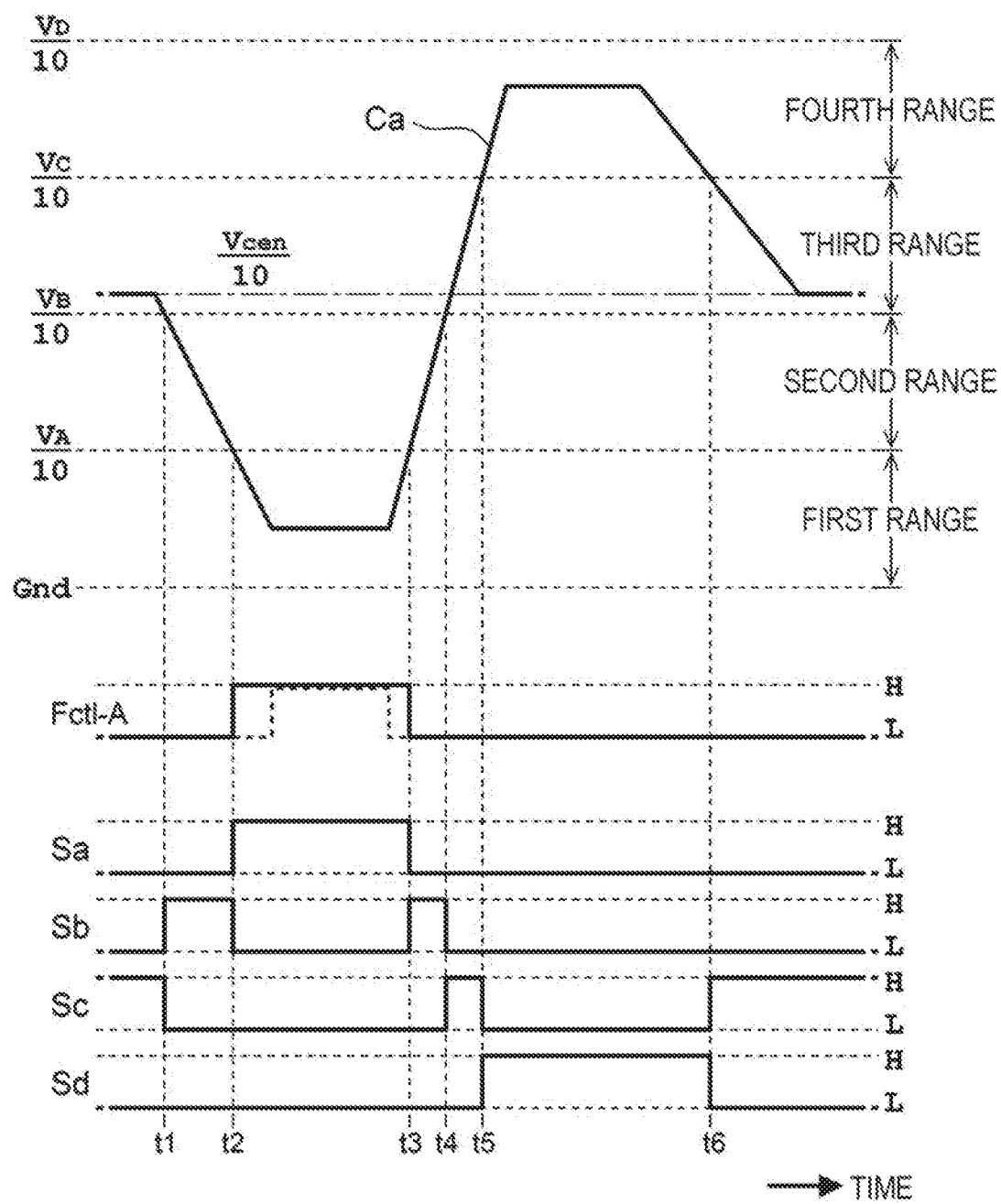
FIG. 18 is a diagram for illustrating an operation of a driving circuit according to a second application example.

However, in the second application example, the controller 110 is configured to set the signal Fctl-A to the level H without changing the configuration of the driving circuit itself according to the first application example only when the voltage of the signal Ca illustrated in FIG. 18 is included in the first range.

In the second application example, if the voltage of the original driving signal Ca belongs to the first range, the driving abilities of the transistors 231a and 232a are reduced, and if the voltage of the original driving signal Ca belongs to any one of the second range, the third range, and the fourth range, the driving abilities of the transistors 231b, 232b, 231c, 232c, 231d, and 232d are improved.

Therefore, according to the second application example, since the oscillation width when the voltage of the original driving signal Ca belongs to the first range is smaller than the oscillation width when the voltage of the original driving signal Ca belongs to the second range, the third range, and the fourth range, the waveform accuracy in a low voltage region can be kept high.

Figure 19:
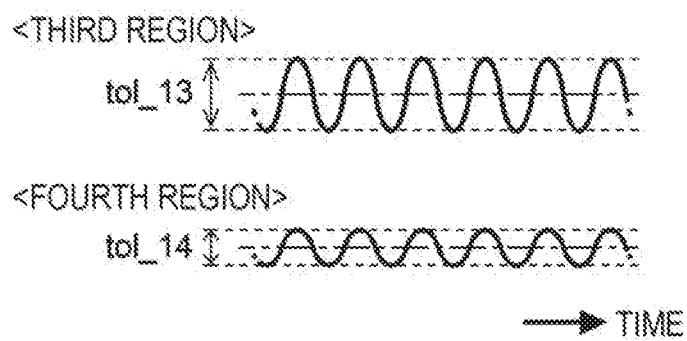
FIG. 19 is a partial enlarged view illustrating a waveform of a driving signal generated by the driving circuit according to the second application example.

In detail, as illustrated in FIG. 19, the driving signal Com-A oscillates with the oscillation width tol_13 around a voltage Vmax in the third region, and oscillates with the oscillation width tol_14 around a voltage Vmin in the fourth region. Since the oscillation width tol_14 is smaller than the oscillation width tol_13, high waveform accuracy can be maintained in a region where the voltage is low, and ejection accuracy of the ink can be improved.

In the second application example, if the voltage of the original driving signal Ca belongs to the first range, the transistors 231a and 232a having the low driving ability are used, and if the voltage of the original driving signal Ca belongs to any one of the second range, the third range, and the fourth range, the transistors 231b, 232b, 231c, 232c, 231d, and 232d having the high driving abilities are used. That is, since the driving ability is fixedly assigned to the voltage range of the original driving signal Ca, resistive elements and capacitors are provided only in the transistors 231a and 232a, and since the driving ability may be lowered, the adjustment circuit 128 is not required.

In the second application example, if the signal Fctl-A is in the level H when the voltage of the original driving signal Ca belongs to the first range, since the dead zone is switched even when the voltage of the original driving signal Ca increases or decreases, influence of noise according to the switching may occur.

Then, the adjustment circuits 128 are provided only in the transistors 231a and 232a, and the signal Fctl-A may become the level H only when the voltage of the driving signal Ca belongs to the first range, as indicated by a broken line of FIG. 18. When a period during which the signal Fctl-A becomes the level H changes, the dead zone is not switched even when the voltage of the original driving signal Ca increases or decreases. Further, since only the oscillation width of the fourth region becomes small, the waveform accuracy when the voltage changes during a constant period in a region where the voltage is low can be kept high.

According to the second application example, although the driving circuit 122a that generates the driving signal Com-A has been described as an example, the driving circuit 122b that generates the driving signal Com-B has the same configuration and the same operation. The following signal Fctl-B is supplied from the controller 110 to the driving circuit 122b according to the second application example. That is, when the voltage of the original driving signal Cb obtained by converting the data dB belongs to the first range or when the voltage of the driving signal Cb belongs to the first range and is constant, the signal Fctl-B becomes the level H.

According to the first application example or the second application example, the number of the transistor pairs is described as "4". However, from the viewpoint of lowering the withstand voltage, the number of the transistor pairs may be "2" or more. Further, the power supply voltages of the transistor pairs may not be equal to each other.

In this way, in the present embodiment, according to the ink jet printer 1 according to the first application example or the second application example (hereinafter, referred to as the embodiments), since voltage followability of the driving signal Com-A (Com-B) with respect to the voltage of the original driving signal Ca (Cb) is high and a voltage error is reduced, the waveform accuracy of the driving signal Com-A (Com-B) can be improved, and the liquid can be ejected at high accuracy.

In the embodiments, since the print head 30 has more than 600 nozzles N arranged at a density of 300 or more per inch, the pitch Py (see FIG. 3) of the nozzles N is very narrow. In detail, as mentioned above, in the nozzle rows L1 and L2 provided in each nozzle plate 632, the nozzles N arranged at a density of 300 or more per inch are shifted from each other by a half of the pitch Py in the sub-scanning direction Y, and the printing can be performed at high definition of 600 dpi or more. In the present embodiment, since the pitch Py is very narrow, the width (the width along the direction Y) of the pressure chamber Sc provided to correspond to the nozzles N is inevitably narrow. Since the width of the pressure chamber Sc is narrow, it is difficult for the pressure chamber Sc to be deformed in the vertical direction. In order to eject a predetermined amount of the ink from the nozzles N, the longitudinal length (the width in a main scanning direction X) of the pressure chamber should be made sufficiently large. Then, in order to eject the predetermined amount of the ink from the nozzles N, the area (the width× the longitudinal length) of the pressure chamber Sc increases as the width becomes narrower (the pitch Py becomes narrower), and accordingly the area S of the piezoelectric element Pzt also increases. Further, since it is necessary to increase the amount of displacement of the piezoelectric element Pzt in order to eject the predetermined amount of the ink from the nozzles N, the thickness of the piezoelectric element Pzt in the Z direction should be reduced. That is, as the nozzles N are arranged at high density to perform high-definition printing, since the area S of the piezoelectric element Pzt increases and the thickness of the piezoelectric element Pzt decreases, the capacitance of the piezoelectric element Pzt increases. As a result, since the load capacitance of the driving circuit 122a (122b) increases and the current I increases, in the driving signal Com-A (Com-B), noise having a magnitude proportional to the product (L×dI/dt) of the parasitic inductance L of the wiring in the FFC 190 or the like and the change rate of the load current I is superimposed in the driving signal Com-A (Com-B), and it is easy for large ripples to occur.

When the large ripples occur in the driving signal Com-A (Com-B), ejection accuracy of the liquid deteriorates. Further, in worst case, the voltage of the driving signal Com-A (Com-B) exceeds an allowable range, the amount of displacement of the piezoelectric element Pzt becomes abnormally large, and thus and the diaphragm 46 (see FIG. 4) may be damaged.

In contrast, according to the embodiments or the like, since the followability of the voltage of the driving signal Com-A (Com-B) to the voltage of the original driving signal Ca (Cb) is high even during the period during which the voltage of the original driving signal Ca (Cb) increases or decreases, the magnitude of the ripples generated in the driving signal Com-A (Com-B) can be kept small even when the load capacity increases. In this way, the ink jet printer 1 according to the present embodiment has a particularly remarkable effect when high-definition printing is performed.

In the present embodiment, the transistor 231 is a P channel transistor, and the transistor 232 is an N channel transistor. However, the transistors 231 and 232 may be the same type transistor. The logic levels of the gate signals Gp and Gn are closely related to the channel type of the transistors 231 and 232. Therefore, in the control signal generating circuit 126 illustrated in FIG. 8, the number of stages of the inverter (NOT circuit) is appropriately changed depending on the channel type of the transistors 231 and 232.

The signal Fctl-A (Fctl-B) is not supplied by the controller 110. However, a detection circuit is separately provided, and the corresponding detection circuit may be configured to detect a change in a voltage defined by the data dA (dB), and output the signal Fctl-A (Fctl-B) according to the change.

Further, the definition may be made based on not the data dA (dB) but the signal Ca (Cb) converted into an analog signal.

What is claimed is:

1. A liquid ejecting apparatus comprising:
   a print head that includes a nozzle and a piezoelectric element displaced by being applied with a driving signal, and ejects a liquid from the nozzle by the displacement of the piezoelectric element;
   a comparator that compares a voltage of an original driving signal with a voltage of a feedback signal which is a signal obtained by feeding back the driving signal;
   a transistor pair that includes a first transistor having a first gate terminal and a second transistor having a second gate terminal, and outputs the driving signal;
   a control signal generating circuit to which an output signal of the comparator is input, and which generates a first control signal for controlling a switching operation of the first transistor and a second control signal for controlling a switching operation of the second transistor such that the first transistor and the second transistor are alternately switched on; and
   an element that changes an output characteristic of the first transistor or the second transistor between the first gate terminal or the second gate terminal and the control signal generating circuit.

2. The liquid ejecting apparatus according to claim 1, wherein the output characteristic is a characteristic of a voltage at which the first transistor or the second transistor is switched on with respect to a voltage of the first control signal or the second control signal.

3. The liquid ejecting apparatus according to claim 1, wherein the element is
   a first capacitor that is capable of being switched to an electric connection state or an electric disconnection state between the first gate terminal and a drain terminal of the first transistor, and
   a second capacitor that is capable of being switched to an electric connection state or an electric disconnection state between the second gate terminal and a drain terminal of the second transistor.

4. The liquid ejecting apparatus according to claim 1, wherein the element is a first resistive element that is capable of being switched to an electric connection state or an electric disconnection state between the first gate terminal and a drain terminal of the first transistor, and
a second resistive element that is capable of being switched to an electric connection state or an electric disconnection state between the second gate terminal and a drain terminal of the second transistor.

5. The liquid ejecting apparatus according to claim 1, wherein the element is a switch that switches driving abilities of the first transistor and the second transistor.

6. The liquid ejecting apparatus according to claim 1, wherein the driving signal has
   a first region in which the first transistor and the second transistor are alternately switched on so that a voltage of the driving signal increases,
   a second region in which the first transistor and the second transistor are alternately switched on so that the voltage of the driving signal decreases,
   a third region following the second region between the first region and the second region, and
   a fourth region following the first region between the first region and the second region, and
   wherein when the voltage of the driving signal belongs to the third region or the fourth region, the first control signal or the second control signal is supplied to the first gate terminal or the second gate terminal through the element.

7. The liquid ejecting apparatus according to claim 6, wherein an oscillation width, which is a difference between a voltage maximum value of the driving signal when the first transistor is switched on and a voltage minimum value of the driving signal when the second transistor is switched on in the third region, is smaller than an oscillation width, which is a difference between a voltage maximum value of the driving signal when the first transistor is switched on and a voltage minimum value of the driving signal when the second transistor is switched on in the fourth region.

8. The liquid ejecting apparatus according to claim 1, wherein in a period during which a voltage of the original driving signal increases, the first transistor and the second transistor are alternately switched on.

9. The liquid ejecting apparatus according to claim 1, wherein in a period during which a voltage of the original driving signal decreases, the first transistor and the second transistor are alternately switched on.

10. The liquid ejecting apparatus according to claim 1, wherein in a period during which a voltage of the original driving signal is constant, the first transistor and the second transistor are alternately switched on.

11. The liquid ejecting apparatus according to claim 1, wherein the print head includes more than 600 nozzles arranged at a density of 300 or more per inch.

12. A liquid ejecting apparatus comprising:
    a print head that includes a nozzle and a piezoelectric element displaced by being applied with a driving signal, and ejects a liquid from the nozzle by the displacement of the piezoelectric element;
    a comparator that compares a voltage of an original driving signal with a voltage of a feedback signal which is a signal obtained by feeding back the driving signal;
    a transistor pair that includes a first transistor having a first gate terminal and a second transistor having a second gate terminal, and outputs the driving signal;
    a control signal generating circuit to which an output signal of the comparator is input, and which generates a first control signal for controlling a switching operation of the first transistor and a second control signal for controlling a switching operation of the second transistor such that the first transistor and the second transistor are alternately switched on; and a gate control circuit that is provided between the first transistor and the second transistor and the control signal generating circuit, and is electrically connected to the first gate terminal and the second gate terminal.

* * * * *